United States Patent
Fan

(10) Patent No.: US 10,190,930 B2
(45) Date of Patent: Jan. 29, 2019

(54) MICRO FEEDBACK-CHAMBER SENSOR AND METHOD OF MANUFACTURING SUCH SENSOR

(71) Applicant: Mei-Yen Lee, Hsin Chu (TW)

(72) Inventor: Chen-Chih Fan, Zhubei, Hsinchu County (TW)

(73) Assignee: Mei-Yen Lee, Hsin Chu (TW)

( * ) Notice: Subject to any disclaimer, the term of this patent is extended or adjusted under 35 U.S.C. 154(b) by 147 days.

(21) Appl. No.: 15/355,686

(22) Filed: Nov. 18, 2016

(65) Prior Publication Data
US 2017/0153158 A1 Jun. 1, 2017

(30) Foreign Application Priority Data
Nov. 26, 2015 (TW) .............................. 104139503 A

(51) Int. Cl.
*B81B 7/00* (2006.01)
*B81C 1/00* (2006.01)
(Continued)

(52) U.S. Cl.
CPC ........ *G01L 9/0073* (2013.01); *B81C 1/00238* (2013.01); *G01L 9/008* (2013.01);
(Continued)

(58) Field of Classification Search
CPC .............. B81B 7/00; B81B 2201/0257; B81B 2201/0264; B81C 1/00; B81C 1/00238;
(Continued)

(56) References Cited

U.S. PATENT DOCUMENTS

2007/0234804 A1* 10/2007 Tamura ............... G01L 19/0069
73/526
2009/0108381 A1 4/2009 Buchwalter et al.
(Continued)

FOREIGN PATENT DOCUMENTS

| TW | 201019453 A | 5/2010 |
| TW | 201238879 A | 10/2012 |
| TW | 201434737 A | 9/2014 |

*Primary Examiner* — Nguyen Q. Ha
(74) *Attorney, Agent, or Firm* — Muncy, Geissler, Olds & Lowe, P.C.

(57) ABSTRACT

A micro feedback-chamber sensor comprises: a semiconductor base having a sensing circuit; a bonding structure layer disposed on the semiconductor base; and a sensing member chip having a low-resistance semiconductor body, a first end portion and a second end portion. The semiconductor body has free-standing Si posts, the first end portion is formed with a sensing member structure, the second end portion is connected to the semiconductor base through the bonding structure layer, and a micro feedback-chamber structure is formed between the sensing member structure, the semiconductor base and the semiconductor body. The sensing member structure is electrically connected to the sensing circuit through the free-standing Si posts. The sensing member structure and the micro feedback-chamber structure collaboratively react to an externally inputted physical signal to generate a sensing signal outputted to the sensing circuit. A method of manufacturing the micro feedback-chamber sensor is also provided.

20 Claims, 18 Drawing Sheets

(51) Int. Cl.
*G01L 9/00* (2006.01)
*G01L 9/12* (2006.01)

(52) U.S. Cl.
CPC .............. *B81B 2201/0257* (2013.01); *B81B 2201/0264* (2013.01); *B81C 2203/0792* (2013.01)

(58) Field of Classification Search
CPC . B81C 2203/0792; G01L 9/00; G01L 9/0073; G01L 9/008; G01L 9/12
See application file for complete search history.

(56) References Cited

U.S. PATENT DOCUMENTS

| | | | |
|---|---|---|---|
| 2010/0109103 A1 | 5/2010 | Tsao | |
| 2012/0212925 A1* | 8/2012 | Zoellin | H04R 19/005 361/807 |
| 2012/0248555 A1 | 10/2012 | Wang et al. | |
| 2013/0334623 A1 | 12/2013 | Wang et al. | |
| 2014/0151822 A1 | 6/2014 | Graham et al. | |
| 2015/0305160 A1* | 10/2015 | Funahashi | H01L 23/49827 348/374 |
| 2015/0369681 A1* | 12/2015 | Imai | G01C 5/06 73/727 |
| 2016/0091384 A1* | 3/2016 | Muller | G01L 19/141 73/715 |
| 2016/0209284 A1* | 7/2016 | Takayama | G01L 19/145 |

* cited by examiner

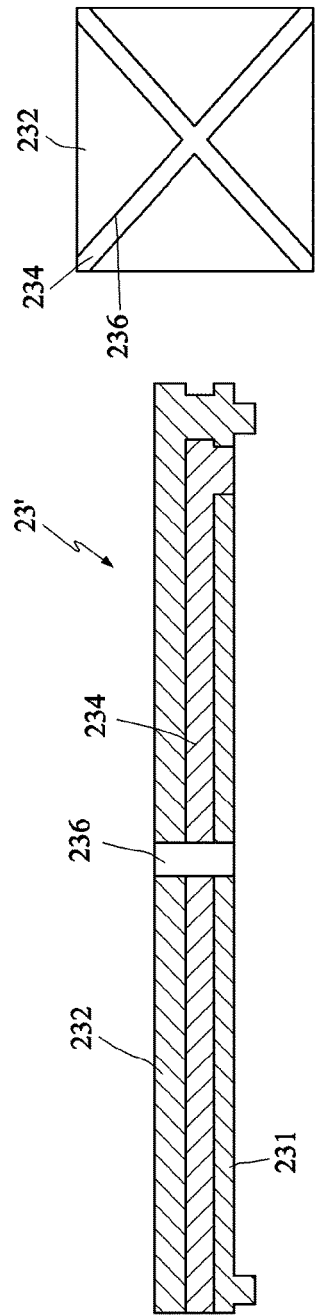
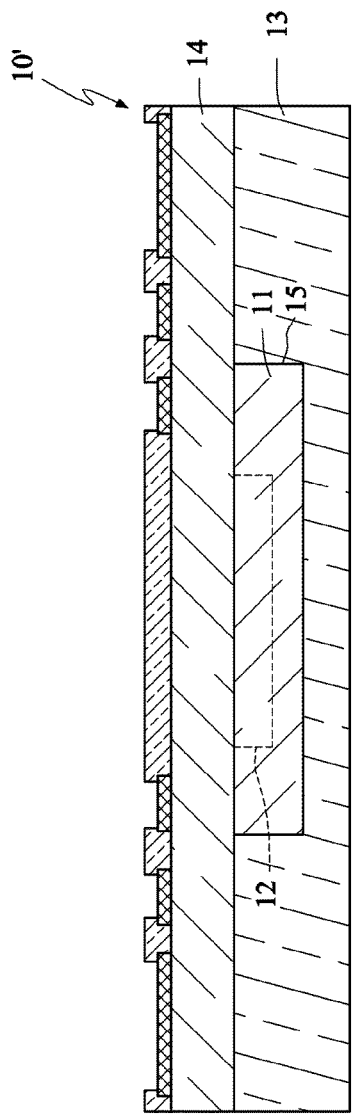
FIG. 8B
FIG. 8A
FIG. 9

MICRO FEEDBACK-CHAMBER SENSOR AND METHOD OF MANUFACTURING SUCH SENSOR

This application claims priority of No. 104139503 filed in Taiwan R.O.C. on Nov. 26, 2015 under 35 USC 119, the entire content of which is hereby incorporated by reference.

BACKGROUND OF THE INVENTION

Field of the Invention

The invention relates to a micro feedback-chamber sensor and a method of manufacturing such sensor, and more particularly to a micro feedback-chamber sensor used in the acoustic wave and/or pressure and a method of manufacturing such sensor.

Description of the Related Art

Currently, most existing micro sensors are based on piezoelectric, piezoresistive and capacitive sensing principles. The piezoelectric sensor converts an input force signal into charges, which are accumulated across the piezoelectric material and can be outputted as a voltage. The piezoresistive sensor has the resistance change after the force is exerted on the piezoresistive material. The most frequently adopted sensing mechanism is based on the capacitive technology, and the capacitive sensor has the good advantages that it can be easily manufactured and that it has the high sensitivity and the low power consumption.

More particularly, a sensor, such as a micro pressure sensor and a micro microphone, has the feedback chamber design. For example, an absolute pressure sensor having a hermetic vacuum feedback chamber generates the structure deformation (piezoelectric, piezoresistive or capacitive physical amount) due to the pressure difference between the chamber and the outside. For instance, the micro microphone requires an acoustic feedback-chamber to reflect the received acoustic signal. Thus, one important sensor quality of the sensor having the feedback chamber design comes from the volume (size) of the feedback chamber. For example, the feedback chamber of the pressure sensor is configured to be kept in a fixed low-pressure state (i.e., approaching the high vacuum state) when being manufactured. After being manufactured, the outgassing effect of the walls of the feedback chamber gradually increases the gas pressure in the feedback chamber. The residual gas affects the measurement due to the thermal expansion and contraction principle. The ideal gas equation is known as $pV=nRT$, where p denotes the pressure of the ideal gas, V denotes the volume of the ideal gas, n denotes the amount of substance of gas, T denotes the thermodynamic temperature of the ideal gas, and R denotes the ideal gas constant. Therefore, if the designed volume of the feedback chamber is increased (V is equivalently increased), then the lower p can be obtained. So, the influence of the thermal expansion and contraction caused by the temperature effect on the sensor is lower.

In addition, the micro microphone is implemented using the conventional package technology, for example. FIG. 14 is a schematic view showing a conventional package of a micro microphone. As shown in FIG. 14, in the process of assembling a conventional micro microphone, a Micro-Electro-Mechanical-System (MEMS) sensing chip 520 and a signal processing chip 530 are separately mounted on a package substrate 510 and then electrically connected together by way of wire bonding. Then, a covering lid 540 covers the MEMS sensing chip 520 and the signal processing chip 530 to form a front chamber. The conventional packaging method can only handle the singulated chip, which way is time and material consuming, and is higher cost. When the package structure of the micro microphone is designed, the following important items have to be carefully evaluated and considered. First, the front chamber distance represents the distance of the space from the sound receiving port, from which the sound pressure enters the sensor, to the diaphragm of the sensor (the conventional distance is equal to the thickness of the covering lid 540 minus the thickness of the substrate 510 and that thickness of the MEMS sensing chip 520, and is generally greater than 300 microns). The too-long front-chamber distance increases the sound resistance and affects the quality. Therefore, in terms of design, the front-chamber distance should be as smaller as possible. Of course, the front-chamber distance may also correspond to the front-chamber volume.

Next, the back-chamber volume (feedback chamber volume) in contrast to the front-chamber volume represents the volume of the inner space formed at least among the diaphragm and the substrate 510, that is, the sealed volume after the sound passes through the diaphragm. A larger back chamber corresponds to a higher sensitivity because the disturbing force of the air exerted on the diaphragm from the back chamber gets smaller when the back-chamber volume gets larger, so that the sensed signal is not distorted. Thus, it is preferred to provide the larger back-chamber volume for the microphone packaging. In addition, it is to be particularly noted that the space inside the back chamber must be completely sealed (only the kept diaphragm is connected to the outside). However, such conventional package is large in form factor, which cannot meet the shrinkage requirement from the development trend of electronics devices (like thinner mobile phone body). Currently, that conventional package thickness is mainly limited by the thicknesses of the substrate and the covering lid. Furthermore, this conventional packaging delivers larger X/Y dimension, which is also facing more and more shrinkage requirements. Another key disadvantage is that the non-monolithic architecture has the worse background noise due to the larger parasitic effect coming from the larger pad area for wire bonding. All these issues will be solved by this invention described hereinafter.

SUMMARY OF THE INVENTION

An object of the invention is to provide a micro feedback-chamber sensor and a method of manufacturing such sensor, so that the chip fusion advantage is obtained, and the sensor can be manufactured in a wafer-level mass production manner to decrease the cost.

Another object of the invention is to provide a micro feedback-chamber sensor and a method of manufacturing such sensor. The micro feedback-chamber sensor may function as a microphone, and can provide the large back chamber and the minor front chamber to enhance the sensing effect of the microphone.

Still another object of the invention is to provide a micro feedback-chamber sensor and a method of manufacturing such sensor. The micro feedback-chamber sensor may function as a pressure sensor, and can provide the large chamber volume to enhance the sensing effect of the pressure sensor.

Yet still another object of the invention is to provide a micro feedback-chamber sensor and a method of manufacturing such sensor, which can provide the functions of a pressure sensor and a microphone.

To achieve the above-identified objects, the invention provides a micro feedback-chamber sensor comprising: a semiconductor base having a sensing circuit; a bonding structure layer disposed on the semiconductor base; and a sensing member chip having a low-resistance semiconductor body, a first end portion and a second end portion. The semiconductor body has free-standing Si posts. The first end portion is formed with at least one sensing member structure. The second end portion is connected to the semiconductor base through the bonding structure layer. At least one micro feedback-chamber structure is formed between the sensing member structure, the semiconductor base and the semiconductor body, The at least one sensing member structure is electrically connected to the sensing circuit through the free-standing Si posts. The at least one sensing member structure and the micro feedback-chamber structure collaboratively react to an externally inputted physical signal to generate a sensing signal outputted to the sensing circuit.

In the micro feedback-chamber sensor, the sensing member chip may further comprise a first electric input/output structure disposed around the micro feedback-chamber structure, and the first electric input/output structure has first connection pads, which are electrically connected to the sensing circuit through the free-standing Si posts The micro feedback-chamber sensor may further comprise a circuit board disposed above the first electric input/output structure and electrically connected to the first connection pads.

In the above-mentioned micro feedback-chamber sensor, the first electric input/output structure may have a connection layer set, and an upper surface of the connection layer set and an upper surface of the sensing member structure are located on the same plane The micro feedback-chamber sensor may further comprise a shielding member, which has a low-resistance semiconductor body, a first end portion and a second end portion, wherein the second end portion of the shielding member is connected to the first end portion of the sensing member chip, an open working chamber is formed after the semiconductor body of the shielding member is partially removed to partially or entirely expose the sensing member structure, and the sensing member structure senses the physical signal, received through the open working chamber, to generate the sensing signal.

In the above-mentioned micro feedback-chamber sensor, the sensing member chip may further comprise a first electric input/output structure disposed around the micro feedback-chamber structure, the first electric input/output structure has first connection pads electrically connected to the sensing circuit through the free-standing Si posts, and the shielding member further comprises a second electric input/output structure disposed around the open working chamber and on the first electric input/output structure, wherein the second electric input/output structure has second connection pads electrically connected to the first connection pads, respectively.

The micro feedback-chamber sensor may further comprise a circuit board disposed above the shielding member and electrically connected to the second connection pads.

In the above-mentioned micro feedback-chamber sensor, the physical signal may enter the open working chamber through gaps between the circuit board and the second connection pads.

In the above-mentioned micro feedback-chamber sensor, the second electric input/output structure may further comprise vertical conductors, which penetrate through the shielding member and are electrically connected to the second connection pads and the first connection pads.

In the above-mentioned micro feedback-chamber sensor, the sensing member structure may comprise: a first electrode plate, which is fixedly disposed on the semiconductor body and has holes; and a second electrode plate movably disposed above the first electrode plate, wherein the first electrode plate and the second electrode plate form a sense capacitor, and a gap is formed between the first electrode plate and the second electrode plate.

In the above-mentioned micro feedback-chamber sensor, the sensing member structure may be a floating structure and sense the physical signal to deform, wherein the floating structure comprises: a first electrode plate; a piezoelectric material layer disposed on the first electrode plate; and a second electrode plate disposed on the piezoelectric material layer.

In the above-mentioned micro feedback-chamber sensor, the semiconductor base may comprise: a first silicon substrate having the sensing circuit; a molding compound layer surrounding one or multiple side surfaces of the first silicon substrate; and a connection layer set, which is disposed on the first silicon substrate and the molding compound layer, and electrically connects the sensing circuit to the sensing member chip.

In the above-mentioned micro feedback-chamber sensor, the shielding member may comprise an exposed conductor layer electrically connected to a constant potential.

In the above-mentioned micro feedback-chamber sensor, the semiconductor base may further have a second sensing circuit, and the sensing member chip may further have at least one second sensing member structure. The semiconductor body is formed with second free-standing Si posts. A second micro feedback-chamber structure is formed among the at least one second sensing member structure, the semiconductor base and the semiconductor body. The at least one second sensing member structure is electrically connected to the second sensing circuit through the second free-standing Si posts. The at least one second sensing member structure and the second micro feedback-chamber structure collaboratively react to an externally inputted second physical signal to generate a second sensing signal outputted to the second sensing circuit.

The invention also provides a method of manufacturing a micro feedback-chamber sensor, and the method comprises the steps of: providing a semiconductor base having a sensing circuit; forming a first bonding structure on the semiconductor base; providing a composite structure layer comprising a sensing structure layer and a semiconductor substrate disposed on the sensing structure layer; bonding the composite structure layer to the semiconductor base through the first bonding structure to form a bonding structure layer; and removing one portion of the composite structure layer to form a sensing member chip having a low-resistance semiconductor body, a first end portion and a second end portion. The semiconductor body has free-standing Si posts, the first end portion is formed with at least one sensing member structure, the second end portion is connected to the semiconductor base through the bonding structure layer, a micro feedback-chamber structure is formed between a bottom portion of the at least one sensing member structure and the semiconductor base, and the at least one sensing member structure is electrically connected to the sensing circuit through the free-standing Si posts. The at least one sensing member structure and the micro feedback-chamber structure collaboratively react to an externally inputted physical signal to generate a sensing signal outputted to the sensing circuit.

In the above-mentioned method, the sensing member chip formed in the step of removing the one portion of the composite structure layer may further comprise a first electric input/output structure disposed around the micro feedback-chamber structure, wherein the first electric input/output structure has first connection pads electrically connected to the sensing circuit through the free-standing Si posts.

In the above-mentioned method, the sensing member chip formed in the step of removing the one portion of the composite structure layer further comprises a shielding member, which has a low-resistance semiconductor body, a first end portion and a second end portion, wherein the second end portion of the shielding member is connected to the first end portion of the sensing member chip, and an open working chamber is formed after the semiconductor body of the shielding member is partially removed to partially or entirely expose the sensing member structure, and the sensing member structure senses the physical signal, received through the open working chamber, to generate the sensing signal.

In the above-mentioned method, the sensing member chip formed in the step of removing the one portion of the composite structure layer may further comprise a first electric input/output structure disposed around the micro feedback-chamber structure. The first electric input/output structure has first connection pads electrically connected to the sensing circuit through the free-standing Si posts, and the shielding member further comprises a second electric input/output structure disposed around the open working chamber and on the first electric input/output structure. The second electric input/output structure has second connection pads electrically connected to the first connection pads, respectively.

With the above-mentioned embodiments, the micro feedback-chamber sensor may function as a microphone or a pressure sensor, or may have the functions of the microphone and the pressure sensor to achieve the sensor fusion effect. In addition, the invention utilizes the wafer-level manufacturing technology to achieve the mass production and reduce the cost. Furthermore, the manufacturing method of the invention can significantly enlarge the volume of the working chamber (back chamber), reduce the front-chamber volume of the microphone, and significantly decrease the form factor of the micro feedback-chamber sensor.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

FIGS. 8A and 8B are a partial cross-sectional view and a schematic top view showing another example of the sensing member structure of the micro feedback-chamber sensor according to each embodiment of the invention.

FIG. 9 is a partial cross-sectional view showing another example of the semiconductor base of the micro feedback-chamber sensor according to each embodiment of the invention.

DETAILED DESCRIPTION OF THE INVENTION

To solve above-mentioned prior art issues, this present invention will propose a monolithic micro sensor with a micro feed-back chamber (i.e. the micro feedback-chamber sensor), which is fabricated by wafer-level processes. Based on this invention, not just a single sensor, but also multi-sensors can be integrated in the same chip for sensors fusion application. The present invention will be apparent from the following detailed description, which proceeds with reference to the accompanying drawings, wherein the same references relate to the same elements.

The micro feedback-chamber sensor having a micro feedback-chamber design according to each embodiment of the invention may function as an acoustic wave sensor (e.g., microphone), an ultrasonic sensor, or a pressure sensor, and may also possess the functions of both the microphone and the pressure sensor, for example, to achieve the sensor fusion effect. Of course, the invention is not restricted thereto because other types of sensors, such as thermal sensors and motion sensors, capable of enhancing the sensor quality by the feedback-chamber design, are applicable to the structure and the process of the invention. In addition, the invention utilizes the wafer-level manufacturing technology to achieve the mass production and reduce the form factor (X/Y/Z) and the cost. Furthermore, the conventional package method for manufacturing a volume of the working chamber (back chamber) is completely omitted from the invention, instead a wafer-level manufacturing method is utilized to manufacture a larger volume of the working/feedback chamber (back chamber), and wafer-level package technology is also adopted to decrease the length of the front chamber of the microphone and significantly reduce the form factor of the micro feedback-chamber sensor. These characteristics are not present in any prior arts. Thus, the characteristics according to each embodiment of the invention will be described in the following, and can be extended to all the sensors requiring the micro feedback-chamber design.

Figure 1:
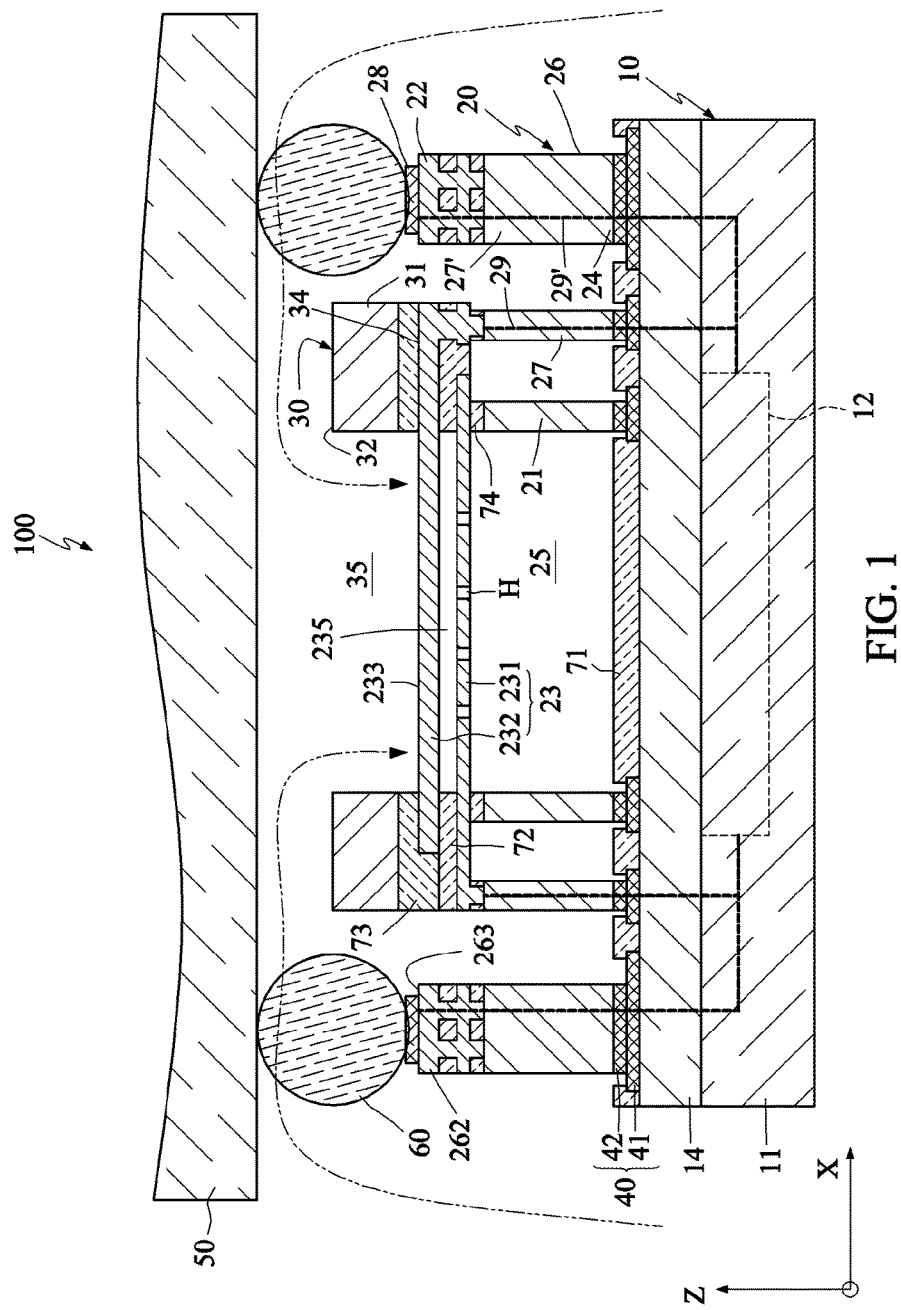
FIG. 1 is a partial cross-sectional view showing a micro feedback-chamber sensor according to a first embodiment of the invention.

FIG. 1 is a partial cross-sectional view showing a micro feedback-chamber sensor 100 according to a first embodiment of the invention. Referring to FIG. 1, the micro feedback-chamber sensor 100 of this embodiment at least comprises a semiconductor base 10, a bonding structure layer 40 and a sensing member chip 20.

The semiconductor base 10 has a sensing circuit 12. For example, the semiconductor base 10 comprises a first silicon substrate 11 and a connection layer set 14. The sensing circuit 12 is formed in the first silicon substrate 11. The connection layer set 14 is disposed on the first silicon substrate 11 and the sensing circuit 12, and electrically connects the sensing circuit 12 to the sensing member chip 20. The connection layer set 14 comprises conductor layers, and inter-layer dielectrics (ILDs) or inter-metal dielectrics (IMDs), mainly provides the electrical connection function, and can be easily finished using the current semiconductor manufacturing technology (like CMOS process), so detailed descriptions thereof will be omitted here.

The sensing member chip 20 has a low-resistance semiconductor body 21, a first end portion 22 (the chip's front side) and a second end portion 24 (the chip's backside). The bonding structure layer 40 is formed on the semiconductor base 10, and comprises a first bonding structure 41 and a second bonding structure 42. The materials of the first bonding structure 41 and the second bonding structure 42 may be selected from the group consisting of aluminum, copper, germanium, gold, tin, indium, silicon and the like. For example, the material of the first bonding structure 41 is aluminum, and the material of the second bonding structure 42 is germanium, wherein the aluminum and the germanium may form the eutectic bonding at about 420 degrees Celsius, and these two materials are compatible with the CMOS process, and are suitable for the application to the integrated circuit design of this embodiment. In another condition, the second bonding structure 42 does not exist, and the silicon material of the silicon semiconductor body 21 itself may be the material of the second bonding structure 42. At this time, the first bonding structure 41 may be gold (Au).

The material of the semiconductor body 21 may be silicon, for example, wherein the silicon semiconductor body 21 is designed and manufactured into several portions to comprise several free-standing silicon (Si) posts 27. The first end portion 22 is formed with at least one sensing member structure 23. The second end portion 24 of the semiconductor body 21 is connected to the semiconductor base 10 through the bonding structure layer 40. A micro feedback-chamber (back-chamber) structure 25 is formed among the at least one sensing member structure 23, the semiconductor base 10 and the circumferential sidewall of the semiconductor body 21. The at least one sensing member structure 23 is electrically connected to the sensing circuit 12 through the free-standing Si posts 27. The free-standing Si posts 27 pertain to one portion of the overall electroconductive path 29. In this embodiment, the sensing member structure 23 comprises a first electrode plate 231 and a second electrode plate 232, and such the arrangement is a capacitive sensing structure. The first electrode plate 231 is fixedly disposed on the silicon semiconductor body 21, and has several holes H, so that when the acoustic waves induce the second electrode plate 232 to vibrate, the air between the two electrode plates reflects the vibration and enter or exit the micro feedback-chamber structure 25 through the holes H. The second electrode plate 232 is movably disposed above the first electrode plate 231. The first electrode plate 231 and the second electrode plate 232 form a sense capacitor. A gap 235 is formed between the first electrode plate 231 and the second electrode plate 232. The design of the second electrode plate 232 depends on the sensor. When the second electrode plate 232 functions as a microphone diaphragm, it may be a resilient structure which is not completely hermetic. When the micro feedback-chamber sensor 100 functions as a pressure sensor, the second electrode plate 232 is a hermetic structure to completely isolate the chamber of the micro feedback-chamber structure 25 from the outside, and deforms by the pressure variation of the fluid to cause the capacitance variation. As a pressure sensor, the micro feedback-chamber structure 25 is a hermetic chamber, especially an ultra-low-pressure chamber. In this embodiment of the invention, the height of the chamber in the micro feedback-chamber structure is completely determined by the thickness of the silicon semiconductor body/wafer 21, and may be manufactured to be greater than or equal to 700 microns. Thus, the embodiment of the invention has the large-volume chamber according to the wafer manufacturing flexibility (the Z-axis dimension is determined by the thickness, and the X-axis and Y-axis dimensions are determined by the mask design). If the conventional packaging method (TSV) structure is used to electrically connect the sensing member structure 23 to the sensing circuit 12, the thickness of the semiconductor body 21 is about 100 to 150 microns under the restriction of the TSV technology (wherein the aspect ratio is around 10). This represents that the chamber volume is only ¼ to 1/10 of that of this invention, and the sensor quality is deteriorated. The main inventive characteristic of the large-volume micro feedback-chamber design comes from the elimination of the TSV design. Instead, the lithography technology is applied to manufacture the freestanding Si posts insulated by the air (in contrast, TSV is embedded into the substrate). In addition, the same processes are utilized to complete this large-volume micro feedback-chamber design. Thus, this is also the characteristic and advantage provided by the embodiment of the invention.

The at least one sensing member structure 23 and the micro feedback-chamber structure 25 collaboratively react to an externally inputted physical signal to generate a sensing signal outputted to the sensing circuit 12. The physical signal comprises, for example but without limitation to, an acoustic wave, a gas pressure or the like. After receiving the acoustic wave, the second electrode plate 232 vibrates to generate the variation of the sense capacitance to obtain the sensing signal. Because the deep etching technology may be adopted to form the micro feedback-chamber structure 25, the volume of the micro feedback-chamber structure 25 may be made to be relatively large, and the sensing effect is significantly enhanced.

It is worth noting that the micro feedback-chamber sensor 100 having the above-mentioned structure can achieve the effect of the embodiment of the invention. Of course, the following additional structures are only provided to make the embodiment of the invention more complete, and do not intend to restrict the invention thereto.

In order to transmit the signal of the sensing circuit 12 upward to the circuit board thereabove, the sensing member chip 20 further comprises a first electric input/output structure 26, which is disposed around the micro feedback-chamber structure 25, has first connection pads 28, and is electrically connected to the sensing circuit 12 through free-standing Si posts 27' formed by portions of the semiconductor body 21, wherein the free-standing Si post 27' is one portion of the overall electroconductive path 29'. Thus, the micro feedback-chamber sensor 100 may further comprise a circuit board 50 disposed above the first electric input/output structure 26, and electrically connected to the first connection pads 28 (e.g., electrically connected to the first connection pads 28 through connection portions 60). In one example, the connection portions 60 may be solder balls, and the ball grid array package (BGA) method is applied to perform the package. Of course, other electrical connection methods may also be adopted.

In addition, because the semiconductor process is utilized, the materials of the first electrode plate 231 and the second electrode plate 232 are polysilicon, for example, and a connection layer set 262 of the first electric input/output structure 26 is also made of polysilicon. Thus, the second electrode plate 232, the first electrode plate 231 and the connection layer set 262 may be finished in the same series of processes. Therefore, an upper surface 263 of the connection layer set 262 and an upper surface 233 of the sensing member structure 23 are disposed on the same plane.

In order to provide the front chamber, the micro feedback-chamber sensor 100 may further comprise a shielding member 30 having a low-resistance semiconductor body 31, a first end portion 32 and a second end portion 34. The second end portion 34 is connected to the first end portion 22 of the sensing member chip 20, and the semiconductor body 31 of the shielding member 30 is partially removed to partially or entirely expose the sensing member structure 23 to form an open working front chamber 35. The sensing member structure 23 senses the physical signal received through the open working front chamber 35 to generate the sensing signal.

It is worth noting that an insulating layer 71 is disposed on the connection layer set 14. The insulating layer 71 is disposed between the portions of the first bonding structure 41 and between the portions of the second bonding structure 42 to provide the insulating effect. In addition, a portion of an insulating layer 72 between the first electrode plate 231 and the second electrode plate 232 is removed (sacrificial layer etching), and a portion of the insulating layer 72 is preserved to support/isolate the first electrode plate 231 and the second electrode plate 232. Also, an insulating layer 73 is formed between the second electrode plate 232 and the semiconductor body 31. Furthermore, an insulating layer 74 is formed between the semiconductor body 21 and the first electrode plate 231. Of course, for the consideration of the manufacturing and electrical properties, the insulating layer may be made of a single-layer material or a composite-layer material.

Figure 2A:
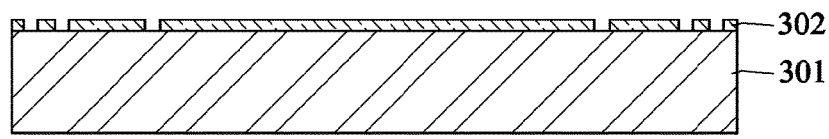
FIGS. 2A to 2F, 3A to 3C and 4A to 4C are partial cross-sectional views showing structures in various steps of the method of manufacturing the micro feedback-chamber sensor according to the first embodiment of the invention.
Figure 2B:
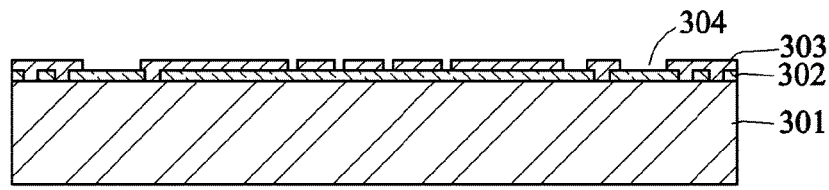
Figure 2C:
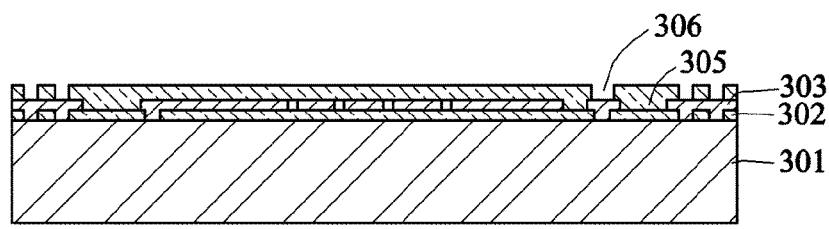
Figure 2D:
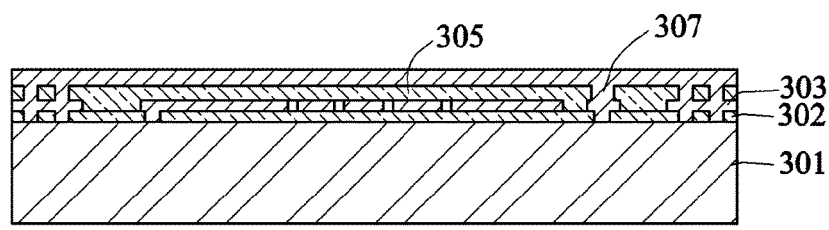
Figure 2E:
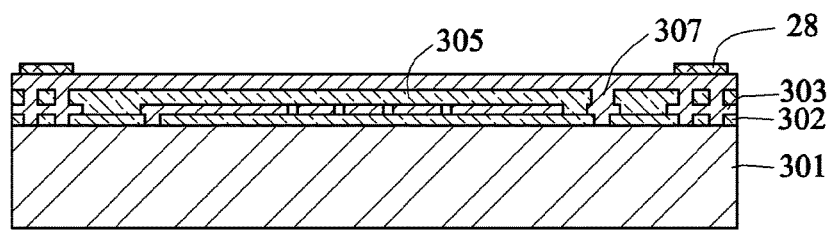
Figure 2F:
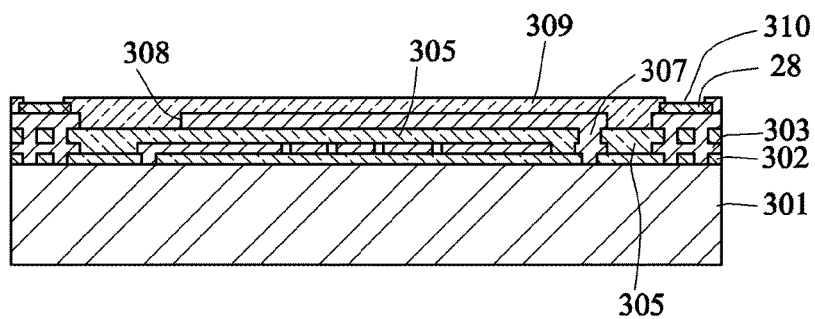
Figure 3A:
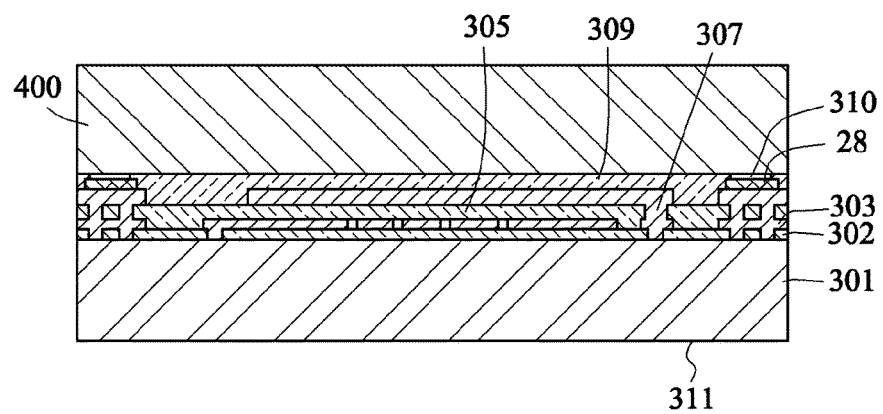
Figure 3B:
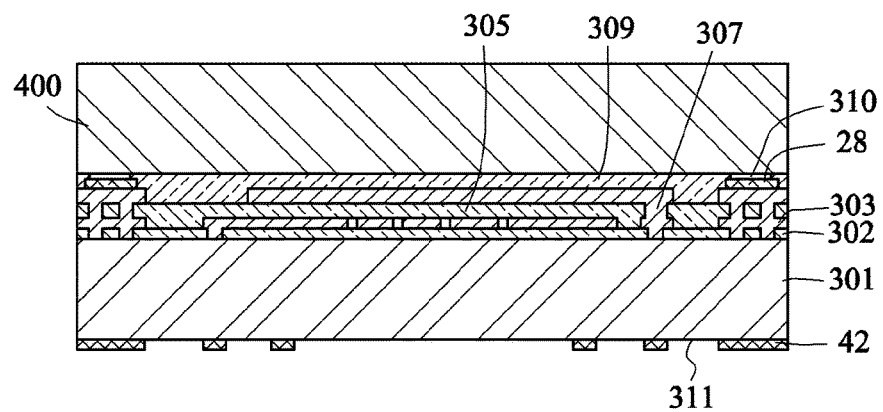
Figure 3C:
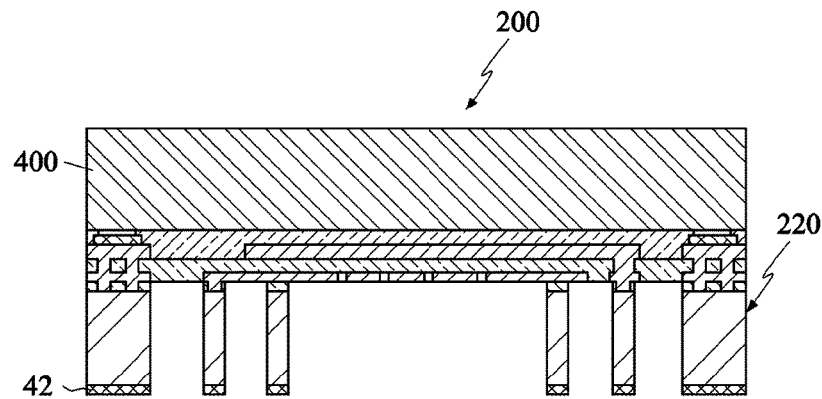
Figure 4A:
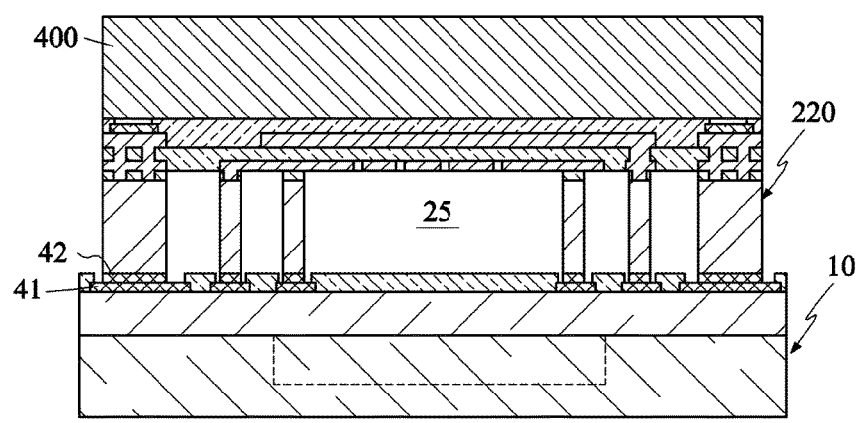

FIGS. 2A to 2F, 3A to 3C and 4A to 4C are partial cross-sectional views showing structures in various steps of the method of manufacturing the micro feedback-chamber sensor according to the first embodiment of the invention. First, as shown in FIG. 1, a semiconductor base 10 having a sensing circuit 12 is provided, and a first bonding structure 41 is formed on the semiconductor base 10. In addition, as shown in FIGS. 2A to 3C, a composite structure layer 200 is provided and comprises: a second bonding structure 42; a sensing structure layer 220 disposed on the second bonding structure 42; and a semiconductor substrate 210 disposed on the sensing structure layer 220. In addition, as shown in FIG. 4A, the second bonding structure 42 of the composite structure layer 200 is bonded to the first bonding structure 41 to form a bonding structure layer 40. When the second bonding structure 42 does not exist, the bonding may also be performed, as mentioned hereinabove. In this condition, the composite structure layer 200 is bonded to the semiconductor base 10 through the first bonding structure 41 to form the bonding structure layer 40.

Figure 4B:
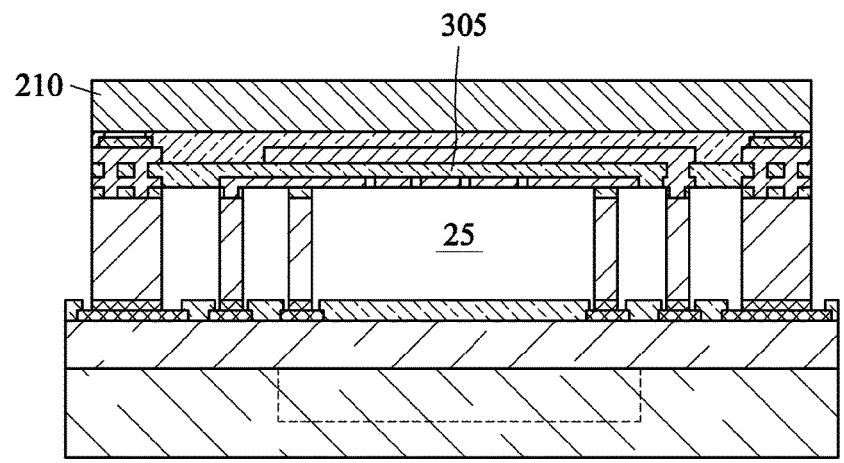
Figure 4C:
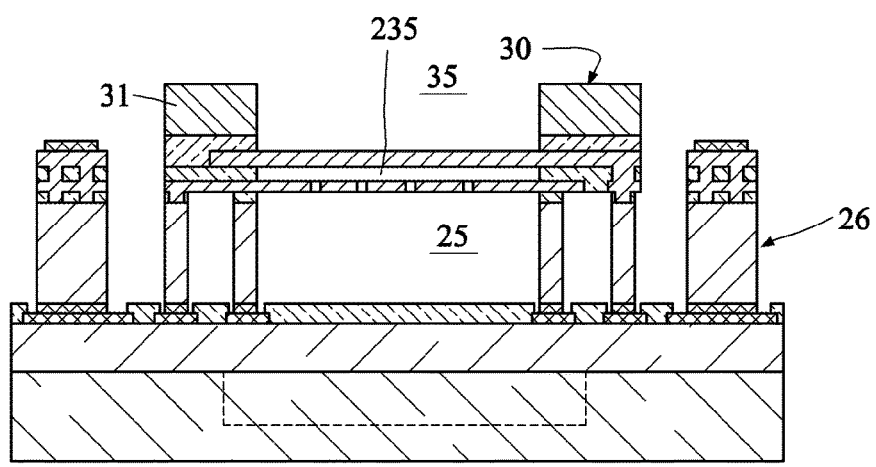

Then, as shown in FIGS. 4A to 4C as well as FIG. 1, one portion of the composite structure layer 200 is removed to form a sensing member chip 20 having a low-resistance semiconductor body 21, a first end portion 22 and a second end portion 24, wherein the semiconductor body 21 is formed with free-standing Si posts 27, the first end portion 22 is formed with at least one sensing member structure 23, the second end portion 24 is connected to the semiconductor base 10 through the bonding structure layer 40, and a micro feedback-chamber structure 25 is formed between the bottom portion of the at least one sensing member structure 23 and the semiconductor base 10. The at least one sensing member structure 23 is electrically connected to the sensing circuit 12 through the free-standing Si posts 27.

The sensing member chip 20 formed after the step of removing the one portion of the composite structure layer 200 may further comprise the first electric input/output structure 26 and the shielding member 30, as shown in FIGS. 4C and 1. The above-mentioned processes may be accomplished using the wafer-level processes to achieve the object of mass production.

Specifically speaking, as shown in FIG. 2A, a semiconductor substrate 301 is provided, and a patterned insulating layer 302 is formed on the semiconductor substrate 301. Then, as shown in FIG. 2B, a patterned first electrode plate layer 303 having openings 304 is formed on the semiconductor substrate 301 and the insulating layer 302. Next, as shown in FIG. 2C, a patterned insulating layer 305 is formed on the first electrode plate layer 303 and the openings 304, wherein the insulating layer 305 has openings 306 to expose portions of the first electrode plate layer 303. Then, as shown in FIG. 2D, a patterned second electrode plate layer 307 is formed on the insulating layer 305 and the first electrode plate layer 303 to entirely fill the openings 306. Next, as shown in FIG. 2E, the first connection pads 28 are formed on the second electrode plate layer 307. Then, as shown in FIG. 2F, portions of the second electrode plate layer 307 are removed to form the openings 308, an insulating layer 309 is formed on the second electrode plate layer 307 and in the openings 308, and openings 310 are formed on the insulating layer 309 to expose the first connection pads 28. It is to be noted that the above-mentioned process may further comprise polishing an uneven surface into a smooth surface by way of chemical-mechanical polishing (CMP) to facilitate the thickness control. In addition, the insulating layer or even the electrode plate layer is not restricted to be made of one single material, and may be made of a composite-layer material. For example, the insulating layer may be one single layer or multiple layers of silicon oxide, silicon nitride, aluminum oxide, silicon carbide (SiC), diamond-like carbon and the like. The electrode plate layer is made of polysilicon in this embodiment, and may also be a composite structure of polysilicon and the above-mentioned insulating layer material, such as an insulating layer/polysilicon/insulating layer.

Then, as shown in FIG. 3A, a semiconductor substrate 400 is attached to the insulating layer 309, and then an interface with the hydrogen bonding strength is formed by way of low-temperature fusion bonding, for example, in this embodiment. Of course, before the low-temperature fusion bonding, wet cleaning may further be performed, and a low-concentration hydrofluoric acid may be used to remove the oxide layer on the surface of the semiconductor substrate 400 (also referred to as HF dipping). In order to achieve the surface activation, the surface plasma treatment may be executed. For example, the workpieces may be exposed to the plasma environment with oxygen ($O_2$) and nitrogen (N₂). In order to make the bonded surface have the high smoothness, the CMP may be executed to polish and smoothen the surfaces to be bonded. Next, as shown in FIG. 3B, the patterned second bonding structure 42 is formed on the lower surface 311 of the semiconductor substrate 301. Then, as shown in FIG. 3C, etching is performed using the second bonding structure 42 as the mask to remove portions of the semiconductor substrate 301 and form the composite structure layer 200 having the sensing structure layer 220. Another manufacturing method may be performed, wherein in the step corresponding to FIG. 3C, a portion of the insulating layer 72 between the first electrode plate 231 and the second electrode plate 232 can be directly removed (referred to as the sacrificial layer etching, as shown in FIG. 1) to finish the capacitive sensing member structure.

Next, as shown in FIG. 4A, the second bonding structure 42 of the composite structure layer 200 is bonded to the first bonding structure 41 to form the bonding structure layer 40 comprising the first bonding structure 41 and the second bonding structure 42. Then, as shown in FIG. 4B, a portion of the semiconductor substrate 210 is removed to thin down the semiconductor substrate 210 and for the purpose of shortening the front-chamber distance. In this embodiment, the front-chamber distance is smaller than 100 microns. Of course, the invention is not restricted thereto. Then, one portion of the semiconductor substrate 210 is removed to form the semiconductor body 31, and one portion of the insulating layer 305 is removed to form the gap 235.

The above-mentioned processes relate to the capacitive sensing technology. When the piezoelectric or piezoresistive sensing technology is applied, for example, the insulating layer 305 is replaced with a piezoelectric material layer, and the first and second electrode plates are formed as the contact electrodes of the piezoelectric material layer. Those skilled in the art can easily understand the details, so detailed descriptions thereof will be omitted here.

Figure 5:
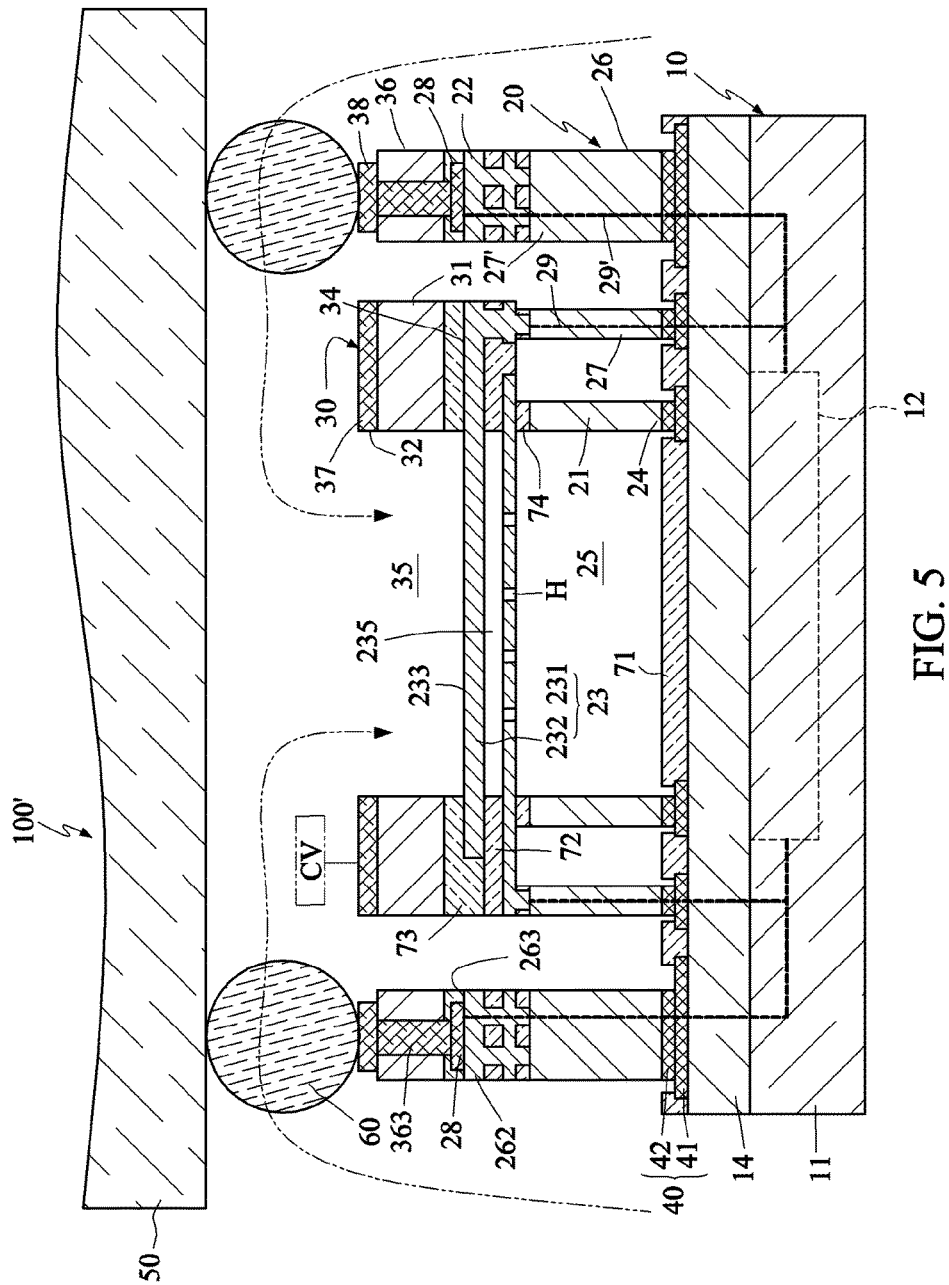
FIG. 5 is a partial cross-sectional view showing a micro feedback-chamber sensor according to a second embodiment of the invention.

FIG. 5 is a partial cross-sectional view showing a micro feedback-chamber sensor 100' according to a second embodiment of the invention. As shown in FIG. 5, this embodiment is similar to the first embodiment except that the shielding member 30 further comprises a second electric input/output structure 36, disposed around the open working chamber 35 and on the first electric input/output structure 26. The second electric input/output structure 36 has second connection pads 38 electrically connected to the first connection pads 28, respectively, and the second electric input/output structure 36 further comprises vertical conductors 363 penetrating through the shielding member 30 and being electrically connected to the second connection pads 38 and the first connection pads 28. In addition, the shielding member 30 comprises an exposed conductor layer 37 electrically connected to a constant potential CV, such as a ground potential or any other potential, so that the semiconductor body 31 becomes a non-floating state to prevent the noise from interfering the sensing result. It is worth noting that the connection portion 60 may also be used to connect the exposed conductor layer 37 to the constant potential of the circuit board 50.

In addition, the circuit board 50 is disposed above the shielding member 30, and electrically connected to the second connection pads 38. Consequently, the physical signal enters the open working chamber 35 through the gap between the circuit board 50 and the second connection pads 38.

FIGS. 6A to 6D are partial cross-sectional views showing structures in various steps of the method of manufacturing the micro feedback-chamber sensor according to the second embodiment of the invention. This front stage of processes of the manufacturing method of this embodiment is similar to that of FIGS. 2A to 4B, and detailed descriptions thereof will be omitted.

Figure 6A:
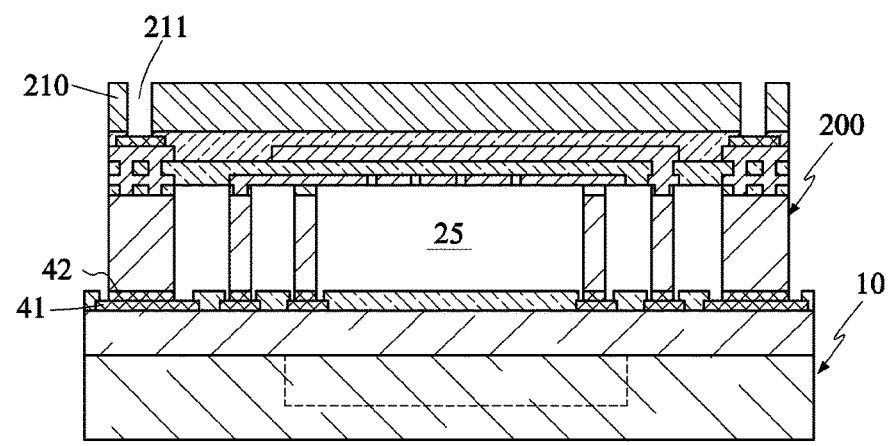
FIGS. 6A to 6D are partial cross-sectional views showing structures in various steps of the method of manufacturing the micro feedback-chamber sensor according to the second embodiment of the invention.
Figure 6B:
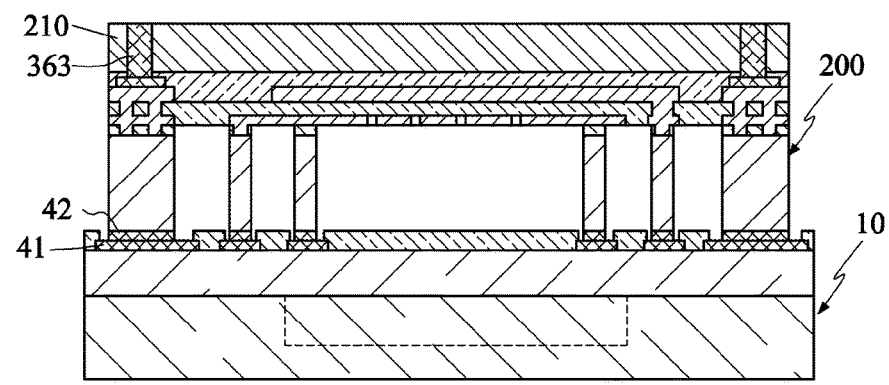
Figure 6C:
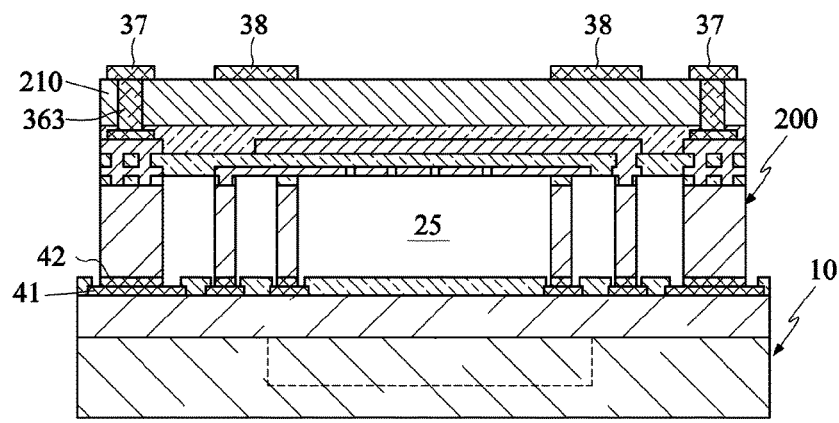
Figure 6D:
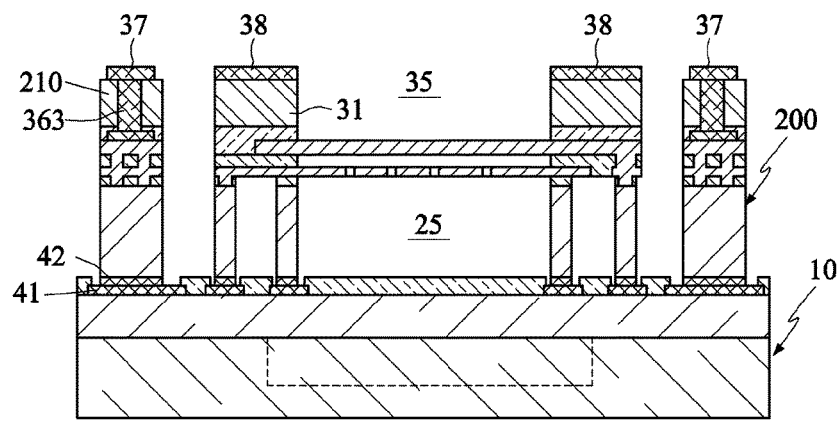

First, as shown in FIG. 6A, deep vias 211 are formed on the semiconductor substrate 210. Then, as shown in FIG. 6B, vertical conductors 363 are formed in the deep vias 211. In this embodiment, the vertical conductor may be made of tungsten (W), copper (Cu) or the like. Next, as shown in FIG. 6C, second connection pads 38 and exposed conductor layers 37 are formed on the semiconductor substrate 210 and the vertical conductor 363. Next, as shown in FIG. 6D, portions of the semiconductor substrate 210 are removed to form the sensing member chip 20. Thus, as shown in FIGS. 6D and 5, the sensing member chip 20 further comprises a first electric input/output structure 26, which is disposed around the micro feedback-chamber structure 25, has first connection pads 28, and is electrically connected to the sensing circuit 12 through the free-standing Si posts 27' formed by the portions of the semiconductor body 21. The shielding member 30 further comprises a second electric input/output structure 36, which is disposed around the open working chamber 35 and on the first electric input/output structure 26, and has second connection pads 38 electrically connected to the first connection pads 28, respectively.

Figure 7:
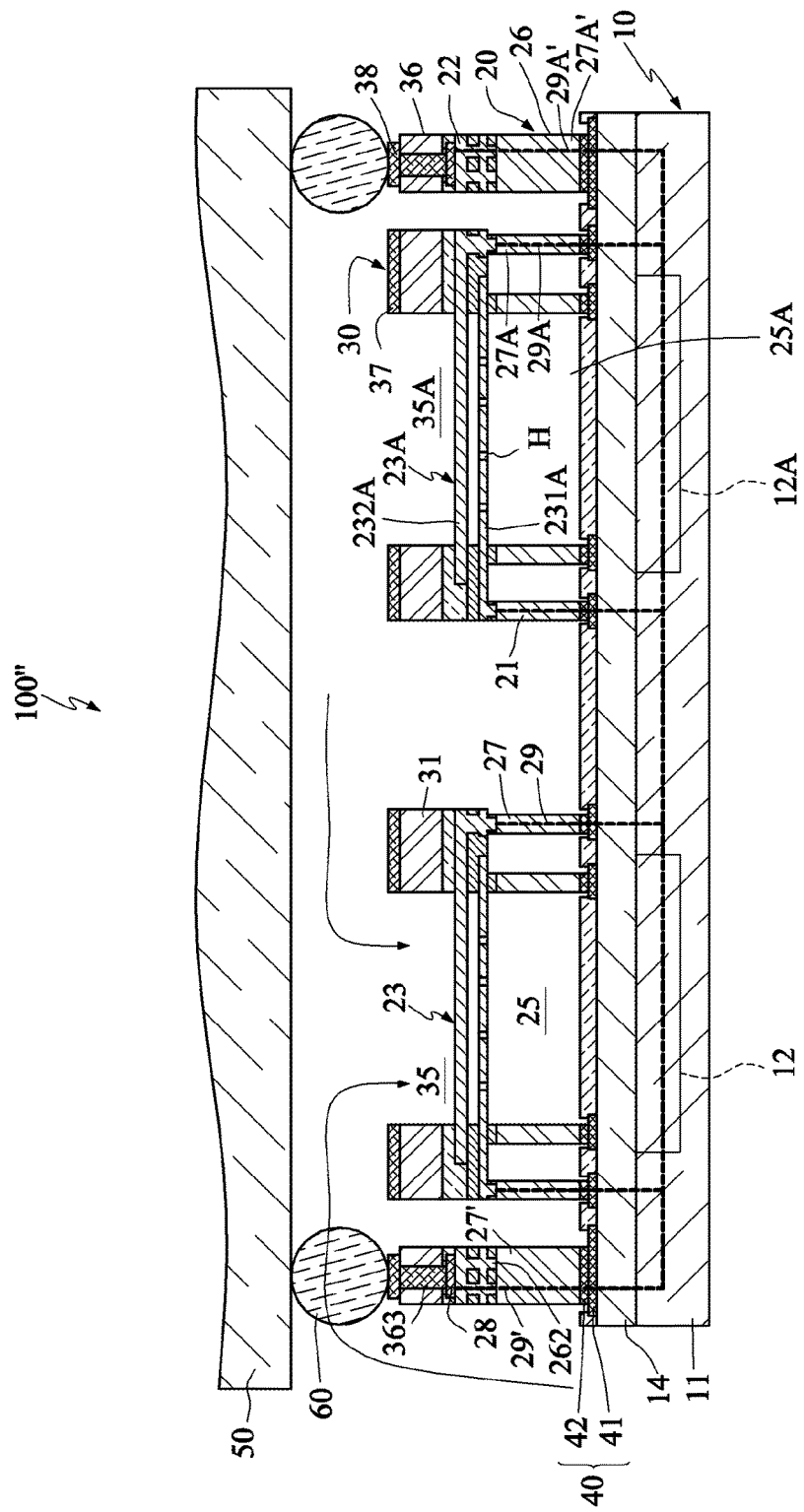
FIG. 7 is a partial cross-sectional view showing a micro feedback-chamber sensor according to a third embodiment of the invention.

FIG. 7 is a partial cross-sectional view showing a micro feedback-chamber sensor 100" according to a third embodiment of the invention. As shown in FIG. 7, this embodiment is similar to the second embodiment except that there are two micro feedback-chamber sensors fused/integrated together. Thus, the semiconductor base 10 further has a second sensing circuit 12A. The sensing member chip 20 further has at least one second sensing member structure 23A. The semiconductor body 21 is formed with second free-standing Si posts 27A and 27A'. A second micro feedback-chamber structure 25A is formed among the at least one second sensing member structure 23A, the semiconductor base 10 and the semiconductor body 21. It is worth noting that the first electrode plate of the second sensing member structure 23A may also have holes H and is not hermetic or closed, so that the insulating layer (e.g., the oxide layer serving as the sacrificial layer) between the first electrode plate 231A and the second electrode plate 232A can be removed. In addition, the at least one second sensing member structure 23A is electrically connected to the second sensing circuit 12A through the second free-standing Si posts 27A, wherein the second free-standing Si post 27A is one portion of the overall second electroconductive path 29A. Furthermore, the first connection pads 28 are electrically connected to the sensing circuit 12 through the second free-standing Si posts 27A' formed by the portions of the semiconductor body 21, wherein the free-standing Si post 27A' is one portion of the overall second electroconductive path 29'. With this structure, the at least one second sensing member structure 23A and the second micro feedback-chamber structure 25A collaboratively react to an externally inputted second physical signal to generate a second sensing signal outputted to the second sensing circuit 12A.

FIGS. 8A and 8B are a partial cross-sectional view and a schematic top view showing another example of the sensing member structure of the micro feedback-chamber sensor according to each embodiment of the invention. As shown in FIGS. 8A and 8B, the sensing member structure 23' is a floating structure for sensing a physical signal to deform, and the floating structure comprises a first electrode plate 231, a piezoelectric material layer 234 and a second electrode plate 232. The first electrode plate 231 is disposed on the semiconductor body 21. The piezoelectric material layer 234 is disposed on the first electrode plate 231. The second electrode plate 232 is disposed on the piezoelectric material layer 234. The piezoelectric material layer 234 deforms to generate the sensing signal. The second electrode plate 232 is formed with a slot 236 to provide the deformation ability.

FIG. 9 is a partial cross-sectional view showing another example of a semiconductor base 10' of the micro feedback-chamber sensor according to each embodiment of the invention. As shown in FIG. 9, the semiconductor base 10' comprises a first silicon substrate 11, a molding compound layer 13 and a connection layer set 14. The first silicon substrate 11 has the sensing circuit 12. The molding compound layer 13 surrounds one or multiple side surfaces 15 of the first silicon substrate 11. The connection layer set 14 disposed on the first silicon substrate 11 and the molding compound layer 13 electrically connects the sensing circuit 12 to the sensing member chip 20. The advantage of this embodiment is that the area (X and/or Y dimension) of the semiconductor base 10' is very small, but the chamber volume of the micro feedback-chamber structure 25 can be enlarged by way of fanning out.

Figure 10:
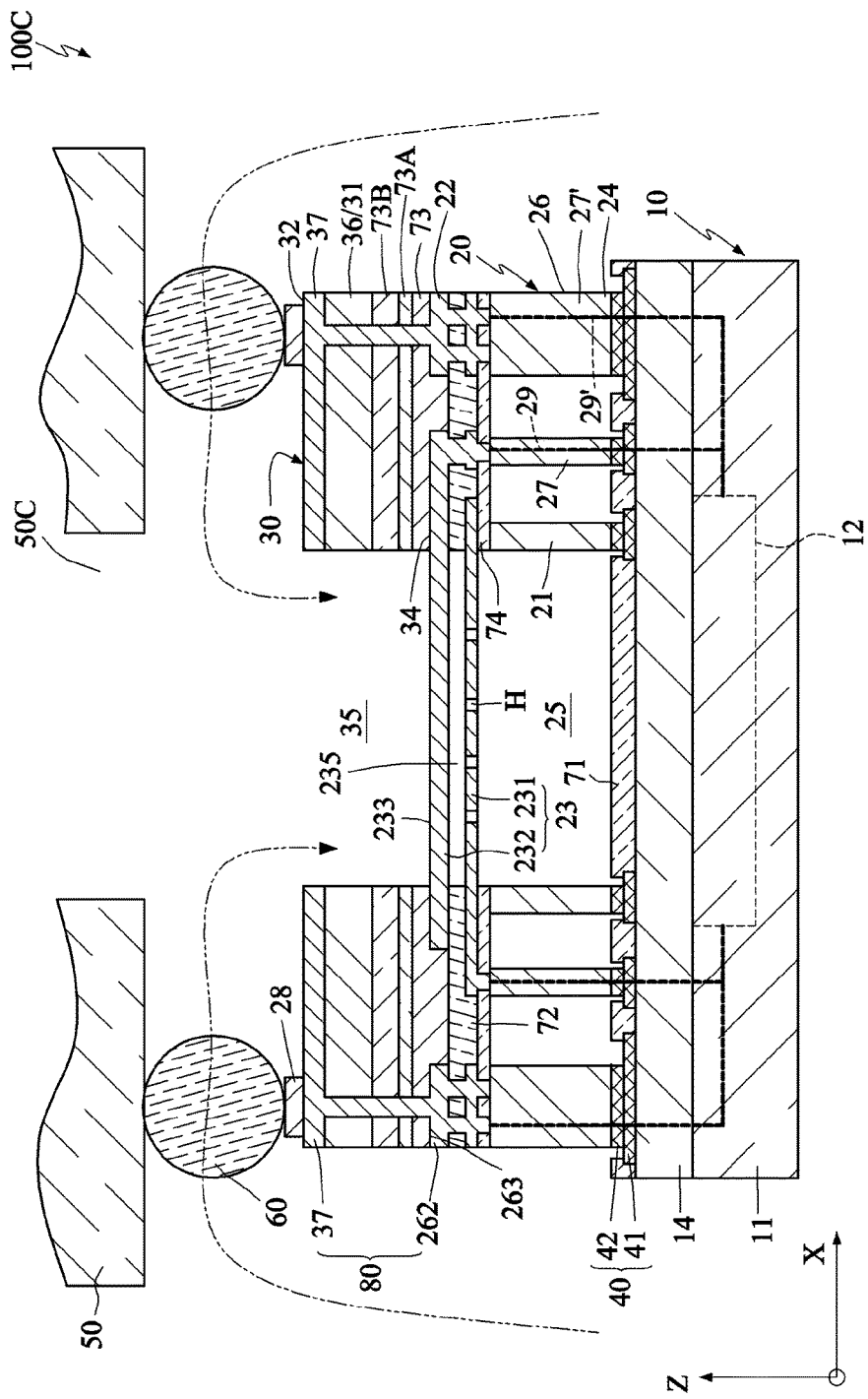
FIG. 10 is a partial cross-sectional view showing a micro feedback-chamber sensor according to a fourth embodiment of the invention.

FIG. 10 is a partial cross-sectional view showing a micro feedback-chamber sensor 100C according to a fourth embodiment of the invention. As shown in FIG. 10, this embodiment is similar to the first embodiment, except that the shielding member 30 comprises an integrated conductor layer 80, which is disposed on the semiconductor body 31, further penetrates through the semiconductor body 31 and one portion of the sensing member chip 20, and is electrically connected to an electric input/output structure 26 of the sensing member chip 20 and thus to the sensing circuit 12. That is, the exposed conductor layer 37 and the connection layer set 262 are integrally connected together to constitute the integrated conductor layer 80, which may be made of the same or different conductor materials. So, the connection layer set 262 and the exposed conductor layer 37 may be regarded as one portion of the integrated conductor layer 80, so that the integrated conductor layer 80 is exposed from the semiconductor body 31, further penetrates through the semiconductor body 31 and the insulating layers 73B, 73A, 73 and 72, is directly connected to the connection layer set 262, and is further connected to the free-standing Si posts 27' of the first electric input/output structure 26. The exposed conductor layer 37 also constitutes a partial boundary of the open working chamber 35, and also has the effect of shielding the noise interference. The micro feedback-chamber sensor 100C may further comprise a circuit board 50, which is disposed above the shielding member 30 and electrically connected to the connection pads 28 of the shielding member 30. The physical signal enters the open working chamber 35 through the gaps between the circuit board 50 and the connection pads 28, and may also enter the open working chamber 35 through an opening 50C of the circuit board 50 corresponding to the open working chamber 35.

FIGS. 11A to 11H and 12A to 12F are partial cross-sectional views showing structures in various steps of the method of manufacturing the micro feedback-chamber sensor according to the fourth embodiment of the invention. The manufacturing method of this embodiment is similar to the first embodiment, and materials and properties used in the similar processes may be applied to all embodiments.

Figure 11A:
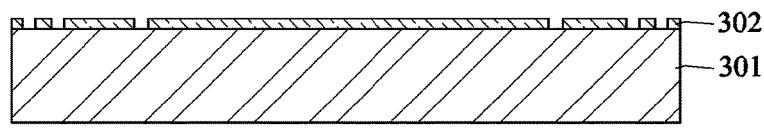
FIGS. 11A to 11H and 12A to 12F are partial cross-sectional views showing structures in various steps of the method of manufacturing the micro feedback-chamber sensor according to the fourth embodiment of the invention.

As shown in FIG. 11A, a low-resistance (e.g., <0.01 Ohm-cm) semiconductor substrate 301, referred to as a first dummy wafer, is provided, and a patterned insulating layer 302 (first insulating layer, such as thermal oxide) is formed on the semiconductor substrate 301. Of course, another etch stop layer, such as nitride, aluminum oxide, silicon carbide or the like, may also be integrated or combined with the first dummy wafer, wherein a first mask is used to perform the lithography in conjunction with one mask to remove the first insulating layer.

Figure 11B:
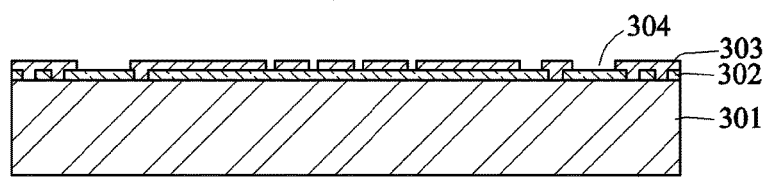

As shown in FIG. 11B, a patterned first electrode plate layer 303 having openings 304 is formed on the semiconductor substrate 301 and the insulating layer 302. For example, a first low pressure chemical vapor deposition (LPCVD) is used to form a N-type low-resistance (<0.01 Ohm-cm) polysilicon, wherein impurities are preferably doped to enhance the electroconductivity thereof in the manufacturing processes to serve as the film material. Meanwhile, annealing may further be performed at the temperature equal to or higher than 1000 degrees Celsius to stabilize the stress, wherein a second mask is used to perform the lithography to remove a portion of the first polysilicon (303).

Figure 11C:
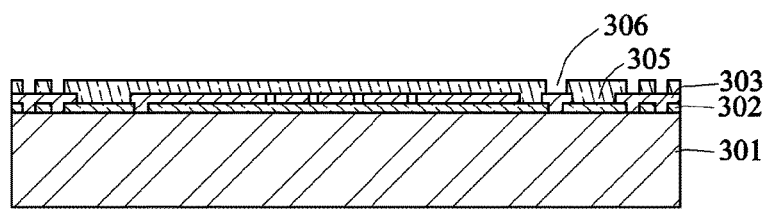

As shown in FIG. 11C, a patterned insulating layer 305 is formed on the first electrode plate layer 303 and the openings 304. The insulating layer 305 has openings 306 to expose portions of the first electrode plate layer 303. The insulating layer 305 is a second insulating layer, which serves as a sacrificial layer with the thickness around 2 microns, and may be made of the material of oxide. The CMP may be performed to smoothen the surface of the oxide layer. Next, a third mask is used to perform the lithography to remove a portion of the surface of the oxide layer, wherein a mask may be added for the ripple or dimple to provide the anti-stiction purpose. FIGS. 11A to 11C may be the same as FIGS. 2A to 2C.

Figure 11D:
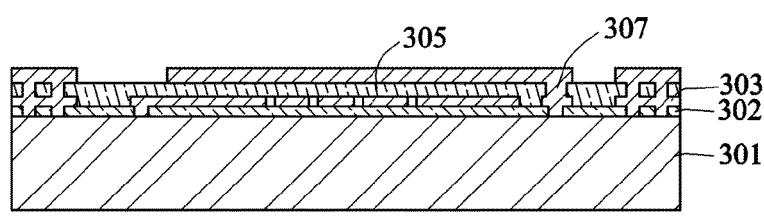

As shown in FIG. 11D, a patterned second electrode plate layer 307 filled into the entire openings 306 is formed on the insulating layer 305 and the first electrode plate layer 303. That is, a second LPCVD is performed to form the N-type low-resistance (e.g., <0.01 Ohm-cm) polysilicon. When being used as a back-plate, the manufacturing parameters may be similar to those of the first electrode plate layer, and comprise performing annealing at or above 1000 degrees Celsius to stabilize the stress, wherein a fourth mask is used to perform the lithography to remove a portion of the second polysilicon (307).

Figure 11E:
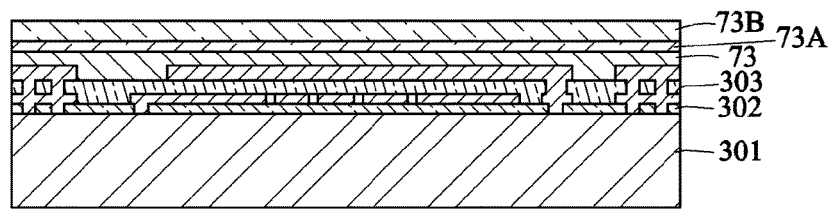

As shown in FIG. 11E, an insulating layer 73 (third insulating layer) made of the material of oxide to serve as another sacrificial layer is formed on the second electrode plate layer 307 and the exposed insulating layer 305, wherein CMP may be performed to smoothen the surface of the oxide layer. Next, an insulating layer 73A (fourth insulating layer), which may be made of the material of nitride, aluminum oxide, silicon carbide, diamond-like carbon or the like, is formed on the insulating layer 73 to serve as an etch stop layer. Then, an insulating layer 73B (fifth insulating layer), which may be made of the material of oxide for fusion bonding, is formed on the insulating layer 73A, wherein CMP may be performed to smoothen the surface of the oxide layer. The insulating layer or even the electrode plate layer is not restricted to the single material, and may comprise a composite-layer material. For example, the insulating layer may be one single layer or a combination of multiple ones of silicon oxide, silicon nitride, aluminum oxide, silicon carbide (SiC), diamond-like carbon and the like. The electrode plate layer of this embodiment is made of polysilicon. Of course, the electrode plate layer may also be a composite structure of polysilicon and the material of the above-mentioned insulating layer, such as an insulating layer/polysilicon/insulating layer.

Figure 11F:
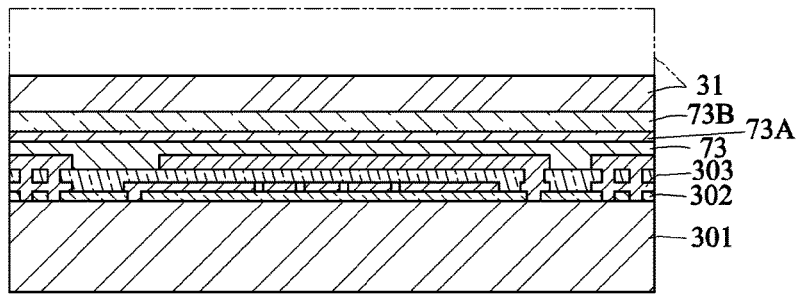

As shown in FIG. 11F, the semiconductor body 31 (a second dummy wafer with the specification that may be the same as that of the first dummy wafer) is bonded to the insulating layer 73B. In this embodiment, both of them are bonded by way of low-temperature fusion bonding to form the interface with the hydrogen bonding strength. Of course, before the low-temperature fusion bonding, wet cleaning may further be performed, and a low-concentration hydrofluoric acid may be used to remove the oxide layer on the surface of the semiconductor substrate 400 (also referred to as HF dipping). In order to achieve the surface activation, the surface plasma treatment may be executed. For example, the workpieces may be exposed to the plasma environment with oxygen ($O_2$) and nitrogen ($N_2$). In order to make the bonded surface have the high smoothness, the CMP may be executed to polish and smoothen the surfaces to be bonded. In addition, the high-temperature annealing at or above 700 degrees Celsius may be performed to enhance the bonding strength. In order to provide the thinned product, the second dummy wafer may be thinned down after fusion bonding. For example, the portion depicted by the phantom lines may be worn out.

Figure 11G:
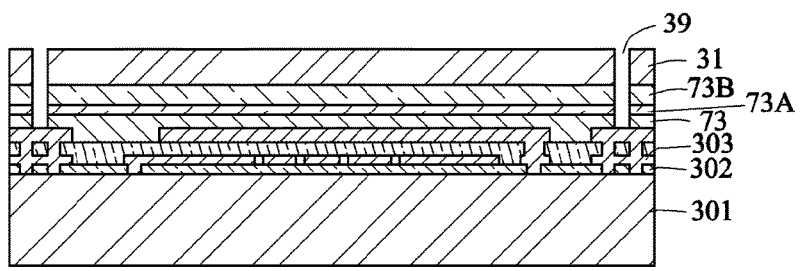

As shown in FIG. 11G, deep vias 39 penetrating through the semiconductor body 31 and the insulating layers 73B, 73A and 73 are formed to expose the polysilicon pertaining to the layer the same as the second electrode plate layer 37. A fifth mask (e.g., the oxide serving as a hard mask) may be used to perform the lithography by the silicon deep etching technology to etch the oxide/nitride/oxide in a self-aligned manner.

Figure 11H:
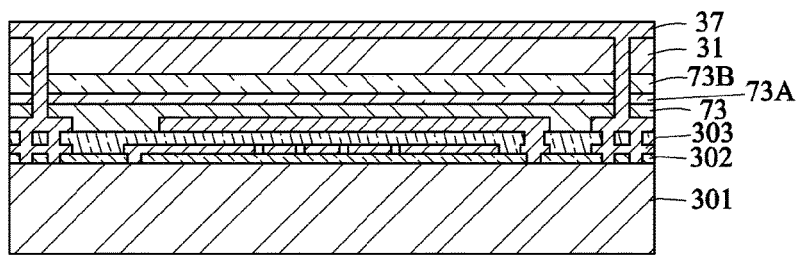

As shown in FIG. 11H, an exposed conductor layer 37 (third polysilicon) is formed in the deep vias 39 and on the semiconductor body 31. However, the invention is not restricted thereto, and any other conductor material including the metal material may also be used. The polysilicon depositing technology may be used, wherein the condition thereof may be the same as or different from those of the first and second polysilicon depositing.

Figure 12A:
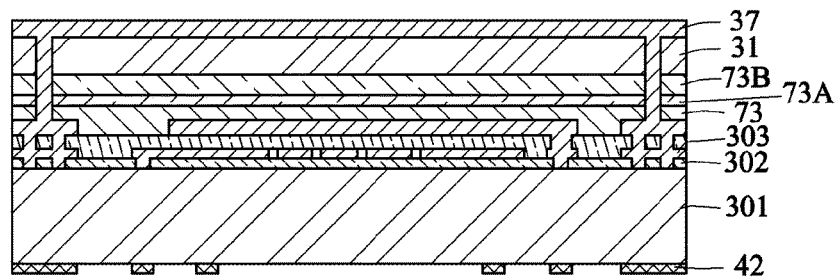

As shown in FIG. 12A, the second bonding structure 42 is formed on the backside of the semiconductor substrate 301. For example, the semiconductor substrate 301 may be thinned down to about 400 microns, and then the second bonding structure 42 is formed on the backside of the semiconductor substrate 301. The materials of the first bonding structure 41 and the second bonding structure 42 may be selected from the group consisting of aluminum, copper, germanium, gold, tin, indium, silicon and the like. For example, the material of the first bonding structure 41 is aluminum, and the material of the second bonding structure 42 is germanium, wherein the aluminum and the germanium may form the eutectic bonding at about 420 degrees Celsius, and these two materials are compatible with the CMOS process, and are suitable for the application to the integrated circuit design of this embodiment. In another condition, the second bonding structure 42 does not exist, and the silicon material of the semiconductor body 21 itself may be the material of the second bonding structure 42. At this time, the first bonding structure 41 may be gold (Au). Here, the metal layer (e.g., germanium (Ge)) is deposited on the backside of the semiconductor substrate 301, and then a sixth mask is used to perform the lithography to pattern the Ge layer.

Figure 12B:
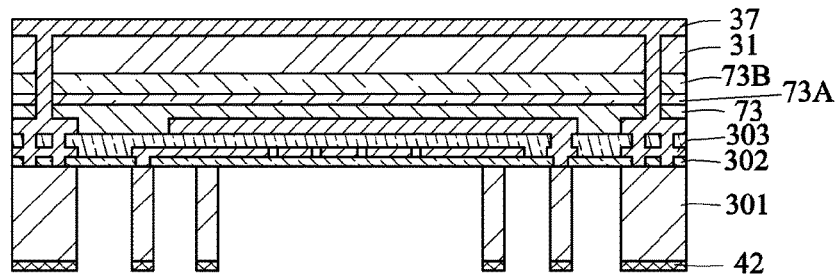

As shown in FIG. 12B, a seventh mask (or an oxide deposition layer serving as a hard mask) is used to perform the deep etching of silicon to reach 400 microns, for example, to form the deep vias.

Figure 12C:
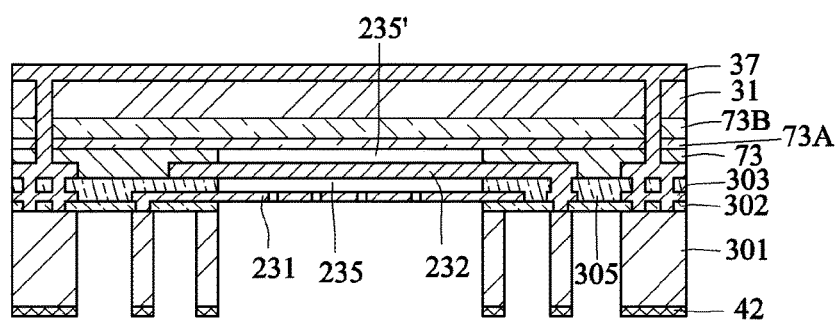

As shown in FIG. 12C, portions of the insulating layers 302 and 305 (sacrificial layers) are removed to expose the first electrode plate 231 and to form the gaps 235 and 235'. Upon operation, a buffer oxide etchant (BOE) or a vapor hydrofluoric acid (Vapor HF) may be used.

Figure 12D:
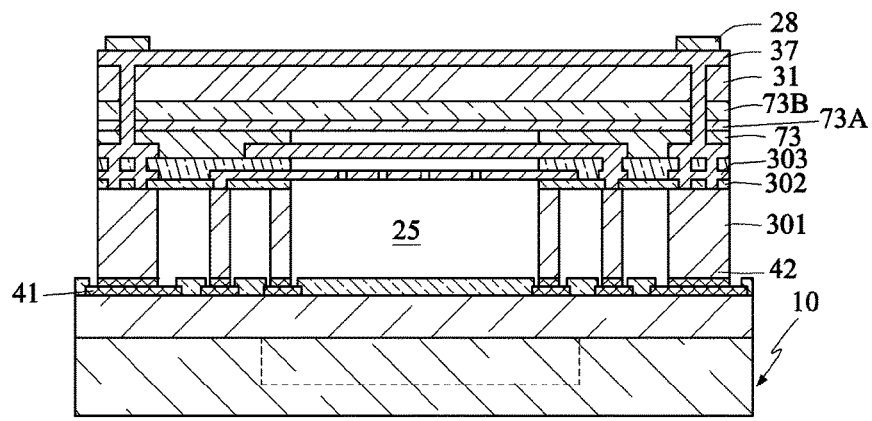

As shown in FIG. 12D, the structure of FIG. 12C is bonded to the semiconductor base 10, on which the first bonding structure 41 and the sensing circuit 12 have been formed, to form eutectic bonding with the second bonding structure 42 to form the micro feedback-chamber structure 25. The semiconductor base 10 pertains to one portion of the microphone wafer. Then, the first connection pads 28 are formed on the exposed conductor layer 37. A metal layer may be formed on the exposed conductor layer 37, and then an eighth mask may be used to perform the lithography, wherein a mask may also be added to serve as a bonding mask.

Figure 12E:
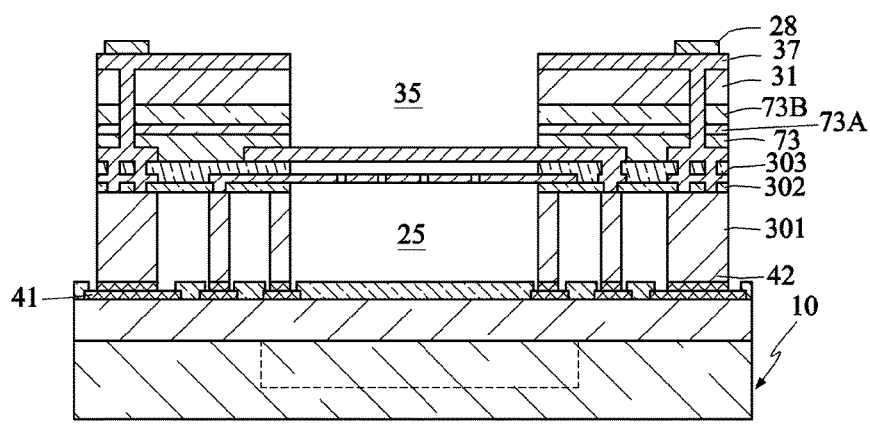

As shown in FIG. 12E, the open working chamber 35 penetrating through the exposed conductor layer 37, the semiconductor body 31 and the insulating layers 73B, 73A and 73 is formed, and combined with the gap 235' of FIG. 12C. Upon manufacturing, a ninth mask may be used to perform the lithography (oxide may be used as a hard mask) and the deep etching of silicon to etch oxide/nitride in a self-aligned manner.

Figure 12F:
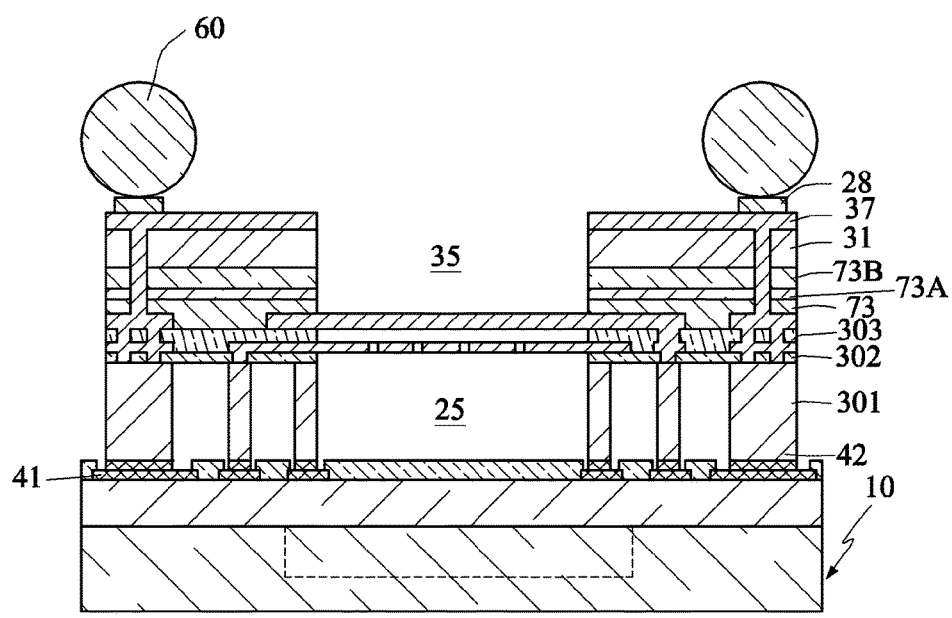

As shown in FIG. 12F, the wafer-level product may be diced and bonded using solder balls as the connection portion 60 to bond the first connection pad 28 to the circuit board 50, as shown in FIG. 10.

Figure 13:
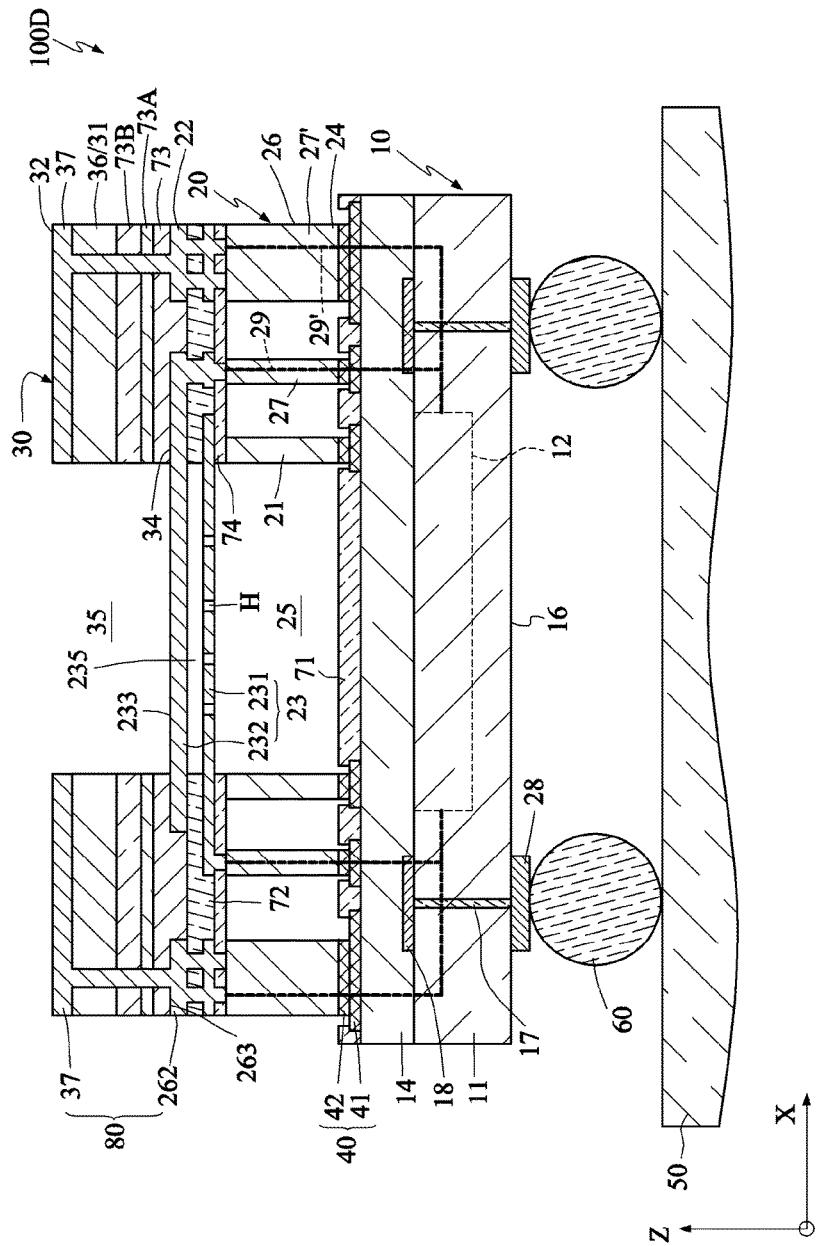
FIG. 13 is a partial cross-sectional view showing a micro feedback-chamber sensor according to a fifth embodiment of the invention.
Figure 14:
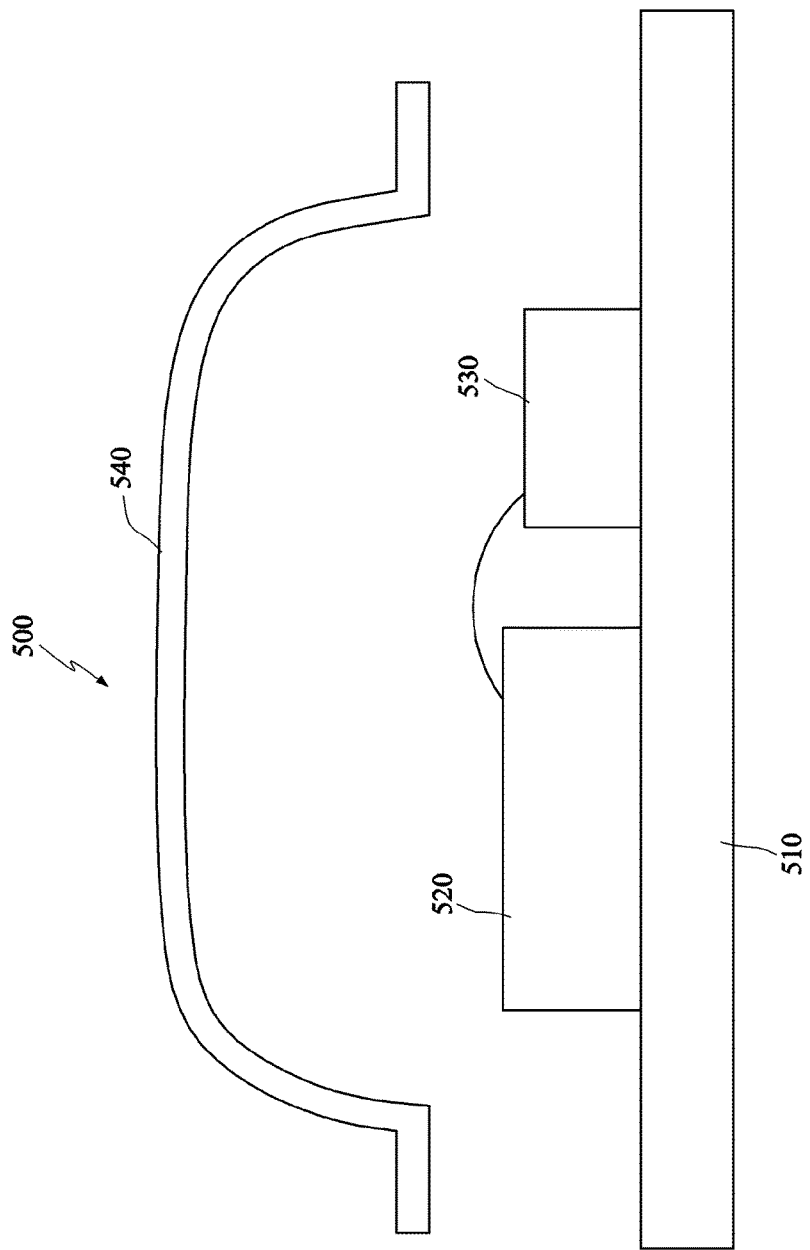
FIG. 14 is a schematic view showing a conventional package of a micro microphone.

FIG. 13 is a partial cross-sectional view showing a micro feedback-chamber sensor 100D according to a fifth embodiment of the invention. As shown in FIG. 13, this embodiment is similar to the fourth embodiment except that the first connection pads 28 are disposed on a lower surface 16 of the semiconductor base 10, and are electrically connected to the sensing circuit 12 through connection pads 18 and conductor plugs 17 formed in the semiconductor base 10. Thus, the circuit board 50 is disposed below the semiconductor base 10, and electrically connected to the first connection pads 28 on the lower surface 16 of the semiconductor base 10. This also can be implemented. It is worth noting that the manufacturing methods of the fourth and fifth embodiments are more compatible with the semiconductor processes, and are more suitable for the mass production.

With the above-mentioned embodiments, the micro feedback-chamber sensor may function as an acoustic wave sensor (e.g., microphone), an ultrasonic sensor, or a pressure sensor, and may also possess the functions of both the microphone and the pressure sensor, for example, to achieve the sensor fusion effect. Of course, the invention is not restricted thereto because other types of sensors, such as thermal sensors including gas sensors and IR sensors, and motion sensors, capable of enhancing the sensor quality by the micro feedback-chamber design, are applicable to the structure and the process of the invention. In addition, the invention utilizes the wafer-level manufacturing technology to achieve the mass production and reduce the cost. Furthermore, the manufacturing method of the invention can significantly enlarge the volume of the working chamber (back chamber), reduce the front-chamber volume of the microphone, and significantly decrease the form factor of the micro feedback-chamber sensor.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed is:

1. A micro feedback-chamber sensor, comprising:
   a semiconductor base having a sensing circuit;
   a bonding structure layer formed on the semiconductor base; and
   a sensing member chip having a low-resistance semiconductor body, a first end portion and a second end portion, wherein the semiconductor body has free-standing silicon (Si) posts, the first end portion is formed with at least one sensing member structure, the second end portion is connected to the semiconductor base through the bonding structure layer, a micro feedback-chamber structure is formed among the at least one sensing member structure, the semiconductor base and the semiconductor body, and the at least one sensing member structure is electrically connected to the sensing circuit through the free-standing Si posts, wherein:
   the at least one sensing member structure and the micro feedback-chamber structure collaboratively react to an externally inputted physical signal to generate a sensing signal outputted to the sensing circuit.

2. The micro feedback-chamber sensor according to claim 1, wherein the sensing member chip further comprises a first electric input/output structure disposed around the micro feedback-chamber structure, and the first electric input/output structure has first connection pads, which are electrically connected to the sensing circuit through the free-standing Si posts.

3. The micro feedback-chamber sensor according to claim 2, wherein the first electric input/output structure has a connection layer set, and an upper surface of the connection layer set and an upper surface of the sensing member structure are located on the same plane.

4. The micro feedback-chamber sensor according to claim 1, further comprising a shielding member, which has a low-resistance semiconductor body, a first end portion and a second end portion, wherein the second end portion of the shielding member is connected to the first end portion of the sensing member chip, an open working chamber is formed after the semiconductor body of the shielding member is partially removed to partially or entirely expose the sensing member structure, and the sensing member structure senses the physical signal, received through the open working chamber, to generate the sensing signal.

5. The micro feedback-chamber sensor according to claim 4, wherein the sensing member chip further comprises a first electric input/output structure disposed around the micro feedback-chamber structure, the first electric input/output structure has first connection pads electrically connected to the sensing circuit through the free-standing Si posts, and the shielding member further comprises a second electric input/output structure disposed around the open working chamber and on the first electric input/output structure, wherein the second electric input/output structure has second connection pads electrically connected to the first connection pads, respectively.

6. The micro feedback-chamber sensor according to claim 5, further comprising:
   a circuit board disposed above the shielding member and electrically connected to the second connection pads, wherein the physical signal enters the open working chamber through gaps between the circuit board and the second connection pads.

7. The micro feedback-chamber sensor according to claim 5, wherein the second electric input/output structure further comprises:

vertical conductors, which penetrate through the shielding member and are electrically connected to the second connection pads and the first connection pads.

8. The micro feedback-chamber sensor according to claim 1, wherein the sensing member structure comprises:
   a first electrode plate, which is fixedly disposed on the semiconductor body and has holes; and
   a second electrode plate movably disposed above the first electrode plate, wherein the first electrode plate and the second electrode plate form a sense capacitor, and a gap is formed between the first electrode plate and the second electrode plate.

9. The micro feedback-chamber sensor according to claim 1, wherein the sensing member structure is a floating structure, and senses the physical signal to deform, wherein the floating structure comprises:
   a first electrode plate;
   a piezoelectric material layer disposed on the first electrode plate; and
   a second electrode plate disposed on the piezoelectric material layer.

10. The micro feedback-chamber sensor according to claim 1, wherein the semiconductor base comprises:
    a first silicon substrate having the sensing circuit;
    a molding compound layer surrounding one or multiple side surfaces of the first silicon substrate; and
    a connection layer set, which is disposed on the first silicon substrate and the molding compound layer, and electrically connects the sensing circuit to the sensing member chip.

11. The micro feedback-chamber sensor according to claim 4, wherein the shielding member comprises an exposed conductor layer electrically connected to a constant potential.

12. The micro feedback-chamber sensor according to claim 4, wherein the shielding member comprises an integrated conductor layer, which is disposed on the semiconductor body of the shielding member, further penetrates through the semiconductor body of the shielding member and one portion of the sensing member chip, and is electrically connected to an electric input/output structure of the sensing member chip and thus electrically connected to the sensing circuit.

13. The micro feedback-chamber sensor according to claim 12, further comprising:
    a circuit board, which is disposed above the shielding member, and electrically connected to connection pads on the shielding member, wherein the physical signal enters the open working chamber through gaps between the circuit board and the connection pads.

14. The micro feedback-chamber sensor according to claim 12, further comprising:
    a circuit board, disposed below the semiconductor base, and electrically connected to connection pads on a lower surface of the semiconductor base.

15. The micro feedback-chamber sensor according to claim 1, wherein:
    the semiconductor base further has a second sensing circuit;
    the sensing member chip further has at least one second sensing member structure, the semiconductor body is formed with second free-standing Si posts, a second micro feedback-chamber structure is formed among the at least one second sensing member structure, the semiconductor base and the semiconductor body, and the at least one second sensing member structure is electrically connected to the second sensing circuit through the second free-standing Si posts, wherein:

the at least one second sensing member structure and the second micro feedback-chamber structure collaboratively react to an externally inputted second physical signal to generate a second sensing signal outputted to the second sensing circuit.

16. A method of manufacturing a micro feedback-chamber sensor, the method comprising the steps of:

providing a semiconductor base having a sensing circuit;

forming a first bonding structure on the semiconductor base;

providing a composite structure layer, comprising a sensing structure layer and a semiconductor substrate disposed on the sensing structure layer;

bonding the composite structure layer to the semiconductor base through the first bonding structure to form a bonding structure layer; and removing one portion of the composite structure layer to form a sensing member chip having a low-resistance semiconductor body, a first end portion and a second end portion, wherein the semiconductor body has free-standing silicon (Si) posts, the first end portion is formed with at least one sensing member structure, the second end portion is connected to the semiconductor base through the bonding structure layer, a micro feedback-chamber structure is formed between a bottom portion of the at least one sensing member structure and the semiconductor base, and the at least one sensing member structure is electrically connected to the sensing circuit through the free-standing Si posts, wherein:

the at least one sensing member structure and the micro feedback-chamber structure collaboratively react to an externally inputted physical signal to generate a sensing signal outputted to the sensing circuit.

17. The method of manufacturing the micro feedback-chamber sensor according to claim 16, wherein the sensing member chip formed in the step of removing the one portion of the composite structure layer further comprises a first electric input/output structure disposed around the micro feedback-chamber structure, wherein the first electric input/output structure has first connection pads electrically connected to the sensing circuit through the free-standing Si posts.

18. The method of manufacturing the micro feedback-chamber sensor according to claim 16, wherein the sensing member chip formed in the step of removing the one portion of the composite structure layer further comprises a shielding member, which has a low-resistance semiconductor body, a first end portion and a second end portion, wherein the second end portion of the shielding member is connected to the first end portion of the sensing member chip, and an open working chamber is formed after the semiconductor body of the shielding member is partially removed to partially or entirely expose the sensing member structure, and the sensing member structure senses the physical signal, received through the open working chamber, to generate the sensing signal.

19. The method of manufacturing the micro feedback-chamber sensor according to claim 18, wherein the sensing member chip formed in the step of removing the one portion of the composite structure layer further comprises a first electric input/output structure disposed around the micro feedback-chamber structure, wherein the first electric input/output structure has first connection pads electrically connected to the sensing circuit through the free-standing Si posts, and the shielding member further comprises a second electric input/output structure disposed around the open working chamber and on the first electric input/output structure, wherein the second electric input/output structure has second connection pads electrically connected to the first connection pads, respectively.

20. The method of manufacturing the micro feedback-chamber sensor according to claim 18, wherein the shielding member comprises an integrated conductor layer, which is disposed on the semiconductor body of the shielding member, further penetrates through the semiconductor body of the shielding member and one portion of the sensing member chip, and is electrically connected to an electric input/output structure of the sensing member chip and thus electrically connected to the sensing circuit.

* * * * *